ится
United States Patent

Brown et al.

(10) Patent No.: US 9,075,318 B2
(45) Date of Patent: Jul. 7, 2015

(54) SEQUENTIAL STAGE MIXING FOR A RESIST BATCH STRIP PROCESS

(75) Inventors: Ian J. Brown, Austin, TX (US); Wallace P. Printz, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 214 days.

(21) Appl. No.: 13/414,554

(22) Filed: Mar. 7, 2012

(65) Prior Publication Data

US 2013/0233351 A1   Sep. 12, 2013

(51) Int. Cl.
  *B08B 7/04*   (2006.01)
  *G03F 7/42*   (2006.01)
  *H01L 21/67*  (2006.01)
  *H01L 21/311* (2006.01)

(52) U.S. Cl.
  CPC ........... *G03F 7/423* (2013.01); *H01L 21/31133* (2013.01); *H01L 21/67017* (2013.01); *H01L 21/6708* (2013.01); *H01L 21/67086* (2013.01)

(58) Field of Classification Search
  USPC ...................................... 134/3, 26
  See application file for complete search history.

(56) References Cited

U.S. PATENT DOCUMENTS

| 5,861,064 | A | * | 1/1999 | Oikari et al. ................. 134/26 |
| 6,032,682 | A | | 3/2000 | Verhaverbeke et al. |
| 6,240,933 | B1 | | 6/2001 | Bergman |
| 6,286,231 | B1 | * | 9/2001 | Bergman et al. ................. 34/410 |
| 6,943,900 | B2 | | 9/2005 | Niu et al. |
| 2001/0042555 | A1 | | 11/2001 | Bergman et al. |
| 2004/0000322 | A1 | | 1/2004 | Verhaverbeke |
| 2007/0123052 | A1 | * | 5/2007 | Kashkoush et al. ........... 438/725 |
| 2010/0018951 | A1 | | 1/2010 | Christenson et al. |
| 2010/0326477 | A1 | | 12/2010 | Dekraker et al. |

OTHER PUBLICATIONS

U.S. Appl. No. 13/413,620, filed Mar. 6, 2012 for Brown1.

* cited by examiner

*Primary Examiner* — Eric Golightly
(74) *Attorney, Agent, or Firm* — Wood, Herron & Evans, LLP

(57) ABSTRACT

Provided is a method and system for stripping a resist film on a plurality of substrates in a resist removal system comprising a processing chamber coupled to a recirculation system comprising a recycle sub-system and a bypass sub-system. The recycle sub-system includes a recycle line, an inline heater, a ratio monitor and control system, and recirculation injection device. The bypass sub-system comprises a treatment liquid supply line, a first injection line, a mixing device, and a second injection line. The treatment liquid comprises a primary stripping chemical, secondary stripping chemical, tertiary stripping chemical, and one or more reactive products. One or more of the temperatures, concentrations, and/or flow rates of the recirculated treatment liquid and/or injected stripping chemicals are adjusted to meet a target strip rate and selectivity for strip over etch of silicon nitride or silicon oxide.

25 Claims, 14 Drawing Sheets

SEQUENTIAL STAGE MIXING FOR A RESIST BATCH STRIP PROCESS

BACKGROUND

1. Field

The present application generally relates to the design of a resist removal system and more particularly to a system and method for increasing strip rate and selectivity of resist strip over etch of silicon nitride or silicon dioxide using batch strip processing.

2. Related Art

Resist strip is a common process in semiconductor manufacturing and historically has been performed in a batch type processing mode with 25 to 100 substrates being immersed in a sulfuric acid and hydrogen peroxide mixture (SPM) for up to 20 minutes. As semiconductor devices shrink in size, a high defect rate is a significant challenge. To address the high defect rate associated with the batch strip processing, focus has switched to increasing the strip rate through a change of the variables of the treatment liquid used in the strip process. Furthermore, single substrate type processes are being developed and used where the cost of ownership and cost per substrate are justified.

For many reasons, economic and technical, single substrate SPM processes operate at higher temperatures (170-250 degrees C.) than batch processes (120-150 degrees C.). For example, to make single substrate SPM processing economically feasible, the resist strip time has to be reduced from about 10 minutes to ideally less than 2 minutes. This can be achieved with the higher process temperatures.

All-wet high dose ion implant resist strip (HDIRS) is also a driver for high temperature single substrate resist strip processing. A key advantage for single substrate processing is that higher temperatures can be utilized to strip the resist. Higher process temperatures have been shown to significantly improve resist strip performance for higher dosed resists (e.g. $>1E^{t5}$ atoms/cm$^2$). However, there are several disadvantages for using higher temperature in resist strip processing including: a) materials selected for use in the chamber materials must be stable in contact with treatment liquid at 225 degrees C., b) significant silicon nitride and silicon dioxide film loss is measured at temperatures above 170 degrees C., and c) a high level of mist can be generated in the process chamber. This is a challenge to make multi-chemical processing possible. For example, SPM processing is typically followed by a standard cleaning 1 (SC1) operation to remove residual particles from the substrate. Presence of SPM mist during the SC1 process creates a defect rate challenge evident in the following chemical reaction:

$$H_2SO_4 + NH_4OH = NH_4SO_4 + H_2O \qquad \text{Reaction 1.0}$$

Desirable in the art are methods and systems that can maintain a high strip rate for a resist and also maintain a high selectivity of strip over etch of silicon nitride or silicon dioxide. In addition, there is a need for a solution that enables high dose ion resist strip performance with lower treatment liquid process temperatures in contact with the substrate. A method and system in both batch and single substrate stripping systems must result in: a) materials compatibility concerns for use in the process chamber being reduced, b) less mist generation and associated improvement in multi-chemical process performance, and c) high resist strip performance with low silicon nitride and silicon dioxide loss. In summary, there is a need for batch strip treatment systems and methods and single substrate systems and methods that can achieve the goals of higher strip rate, higher strip selectivity, target strip time, and/or lower cost of ownership.

SUMMARY

Provided are a method and system for stripping a resist film on a plurality of substrates in a resist removal system comprising a processing chamber coupled to a recirculation system comprising a recycle sub-system and a bypass sub-system. The recycle sub-system includes a recycle line, an inline heater, a ratio monitor and control system, and recirculation injection device. The bypass subsystem comprises a treatment liquid supply line, a first injection line, a mixing device, and a second injection line. The treatment liquid comprises a primary stripping chemical, secondary stripping chemical, tertiary stripping chemical, and one or more reactive products. One or more of the temperatures, concentration, and/or flow rates of the recirculated treatment liquid and injected stripping chemicals are adjusted to meet a target strip rate and selectivity of strip over etch of silicon nitride and silicon oxide.

DETAILED DESCRIPTION OF EXEMPLARY EMBODIMENT(S)

In order to facilitate the description of the present invention, a semiconductor substrate is utilized to illustrate applications of the concept. The methods and processes equally apply to other workpieces such as a wafer, disk, memory or the like. Similarly, aqueous sulfuric acid and hydrogen peroxide mixture is utilized to illustrate a treatment liquid in the present invention. As mentioned below, other treatment liquids can alternatively be used. The treatment liquid can include primary, secondary, and tertiary stripping chemicals and reaction products. In this application, a reference to silicon nitride also includes silicon oxide and/or silicon.

Figure 1:
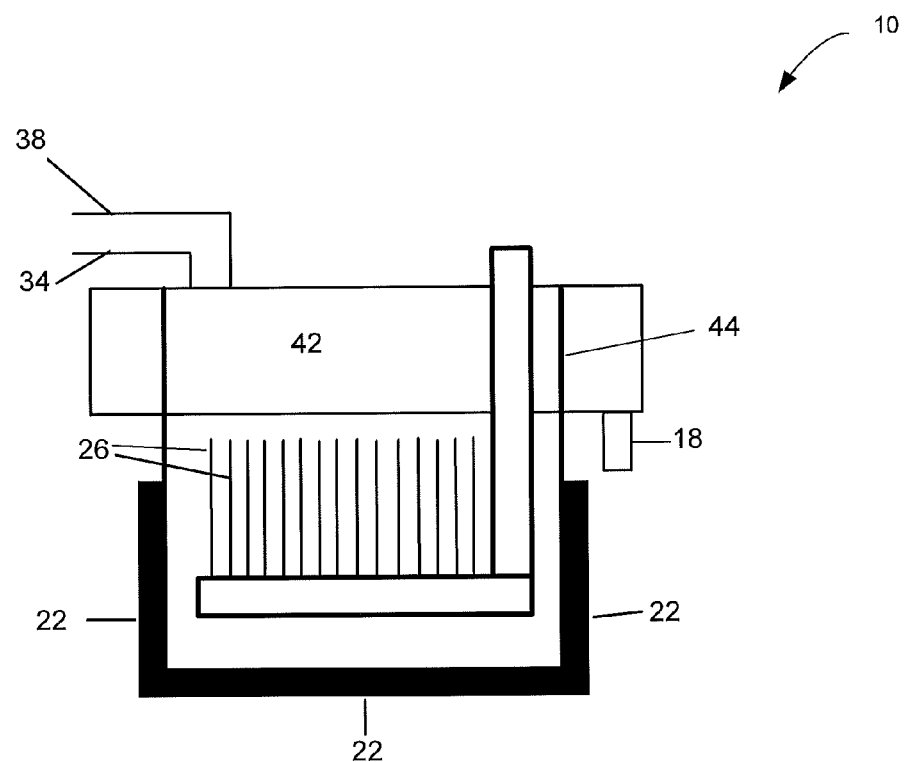
FIG. 1 is an architectural diagram illustrating a prior art method of resist stripping in a batch strip process.

Referring to FIG. 1, an architectural diagram 10 illustrating a prior art method of resist stripping in a batch strip process where the stripping chemicals (etchants) are dispensed using one or more input streams, 34 and 38, into the processing chamber 44 where a plurality of substrates 26 are positioned. The etchants may be reused or recycled or disposed of using the overflow tank 42 and overflow spout 18. Heaters 22 can be provided for example by having heaters on the sides and/or at the bottom of the process chamber 44. The heaters may be external or inline.

It is well understood the resist strip rate in sulfuric acid is strongly influenced by temperature, where the strip rate rises in response to a rise in temperature. High temperature is beneficial for SPM processing to generate a high concentration of Caro's acid:

$$H_2SO_4 + H_2O_2 = H_2SO_5 + H_2O \qquad \text{Reaction 2.0}$$

and associated radicals from decomposition, $$H_2SO_5 = H_2SO_4 + O \qquad \text{Reaction 3.0}$$

and $$H_2O_2 = H_2O + O \qquad \text{Reaction 4.0.}$$

Silicon nitride etch rate (ER) is a strong function of temperature and concentration of water, $H_{+2}+O$, and hydronium ion, $H_3O^+$, species in the SPM as shown by the rate equation below. Ideally the SPM temperature should be below 185 degrees C. to minimize the value of k:

$$Si_3N_4 \text{ Etch Rate}(ER) = k[H_2O] \times [H_3O^+] \qquad \text{Equation 1.}$$

One embodiment of the present invention includes a novel method for a staged mixing regime to leverage the advantage of high temperature for Caro's acid and radical generation for resist removal and quenching to minimize silicon nitride, silicon dioxide, and/or silicon loss. An improvement in resist strip performance can be realized with a staged mixing nozzle even with the same mixing ratio of SPM compared to a standard nozzle. The embodiment utilizes the staged mixing approach and a design of the mixing nozzle to maximize resist strip chemistry concentration in order to maintain performance after the SPM is cooled prior to dispensing onto a portion of a surface on the substrate. As mentioned above, the advantage of this method and system is that improvements in both resist strip performance and silicon nitride and dioxide film loss can be realized even while using the same SPM mixing ratio.

Staged mixing approach and injection of stripping chemicals can be implemented in a single substrate stripping system and on a wet bench or batch stripping system. In a batch stripping system, the direct injection of hydrogen peroxide in the processing chamber is replaced with a staged mixing nozzle or treatment liquid delivery system equipped with stage mixing and Caro's acid can be injected into the treatment liquid instead of hydrogen peroxide.

The embodiment requires several operational considerations during the strip processing. For example, additional hardware for the staged mixing and controlling two sulfuric acid delivery sub-systems are required. If back-pressure is utilized in the nozzle to reach higher reacting temperatures, then adequate safety systems have to be put in place to protect people and equipment. Residence time of the treatment liquid from mixing to dispense needs to be optimized to ensure that maximum concentration of Caro's acid and oxidation radicals occur on the substrate surface.

Figure 2:
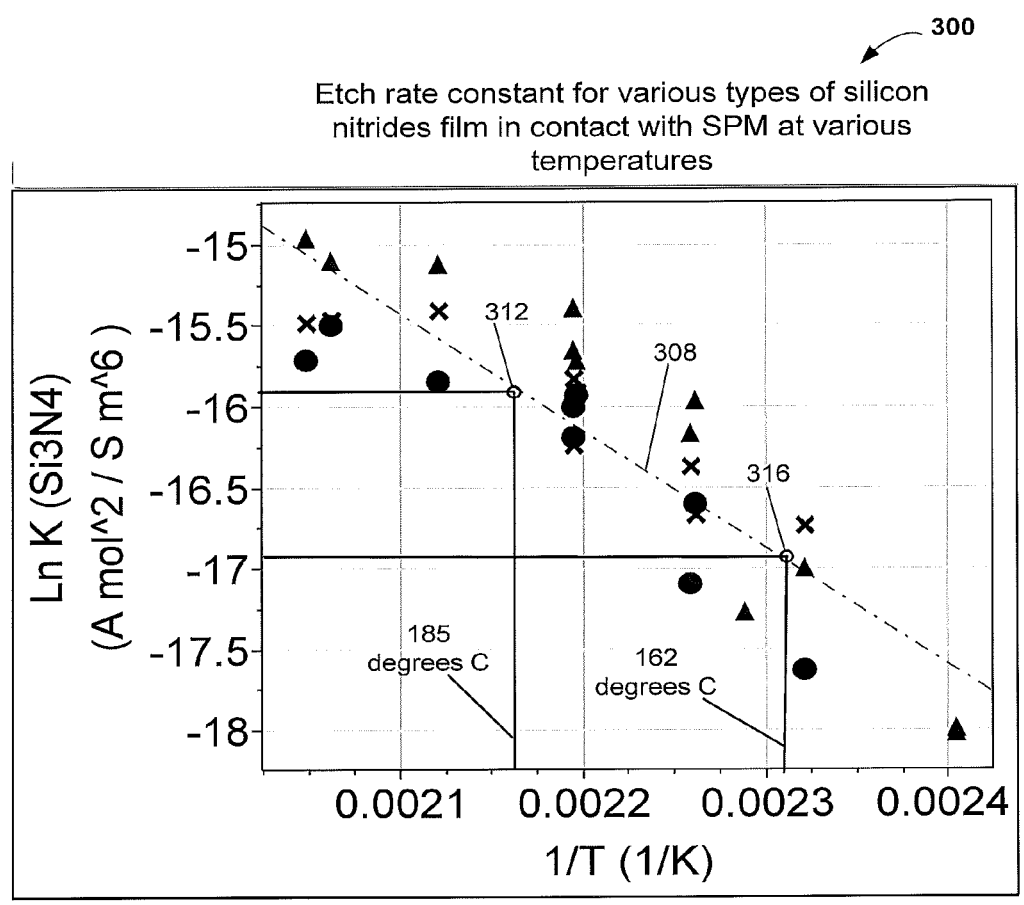
FIG. 2 depicts an exemplary Arrhenius graph for silicon nitride etch rate constant k versus the inverse of the absolute temperature of the sulfuric acid hydrogen peroxide mixture (SPM).

FIG. 2 depicts an exemplary Arrhenius graph 300 for silicon nitride etch rate constant k versus the inverse of the absolute temperature of the sulfuric acid hydrogen peroxide mixture (SPM).

The equations for determining the etch rate are:

$$ER = k[H_2O][H_3O^+] \qquad \text{Equation 2}$$

where
ER is the etch rate for silicon nitride,
k is the etch rate constant for silicon nitride,
$H_2O$ is the concentration of water in moles/m$^3$, and
$H_3O^+$ is the concentration of hydronium ions in moles/m$^3$;

$$Ln(k) = A - \frac{E}{R}\frac{1}{T} \qquad \text{Equation 3}$$

where
Ln is the natural logarithm,
k is the etch rate constant for silicon nitride,
A is the pre-exponential factor for silicon nitride,
E is the activation energy,
R is the universal gas constant, and
T is the absolute temperature of the SPM.

Referring to FIG. 2, the trend line of the etch rate is curve 308 where 1/T is plotted on the X-axis; values of the etch rate for silicon nitride using SPM at the temperature of the SPM and the corresponding value of the natural logarithm of the etch rate constant of silicon nitride, expressed as Angstrom mol$^2$/seconds meter$^6$ is plotted on the Y-axis. The etch rate curve 308 is approximated by a straight line sloping down as the temperature of the treatment liquid goes down. For example, the value of the natural logarithm of the etch rate constant, Ln k, for silicon nitride is about −15.9 at point 312 with the SPM at a temperature of about 185 degrees C. while the value of Ln k is about −16.9 at point 316 with the SPM at a temperature of about 162 degrees C. When the temperature of the SPM is to the right of the etch rate curve 308, the etching of silicon nitride is kept advantageously lower with a lower SPM temperature. Silicon nitride etch rate is so strongly correlated with temperature that a practical means to minimize the etch rate is to keep the temperature of the SPM below 170 degrees C. (on FIG. 2 this equates to 0.002257).

The challenge and embodiments of this invention are methods to increase the resist strip performance at lower temperatures.

Figure 3A:
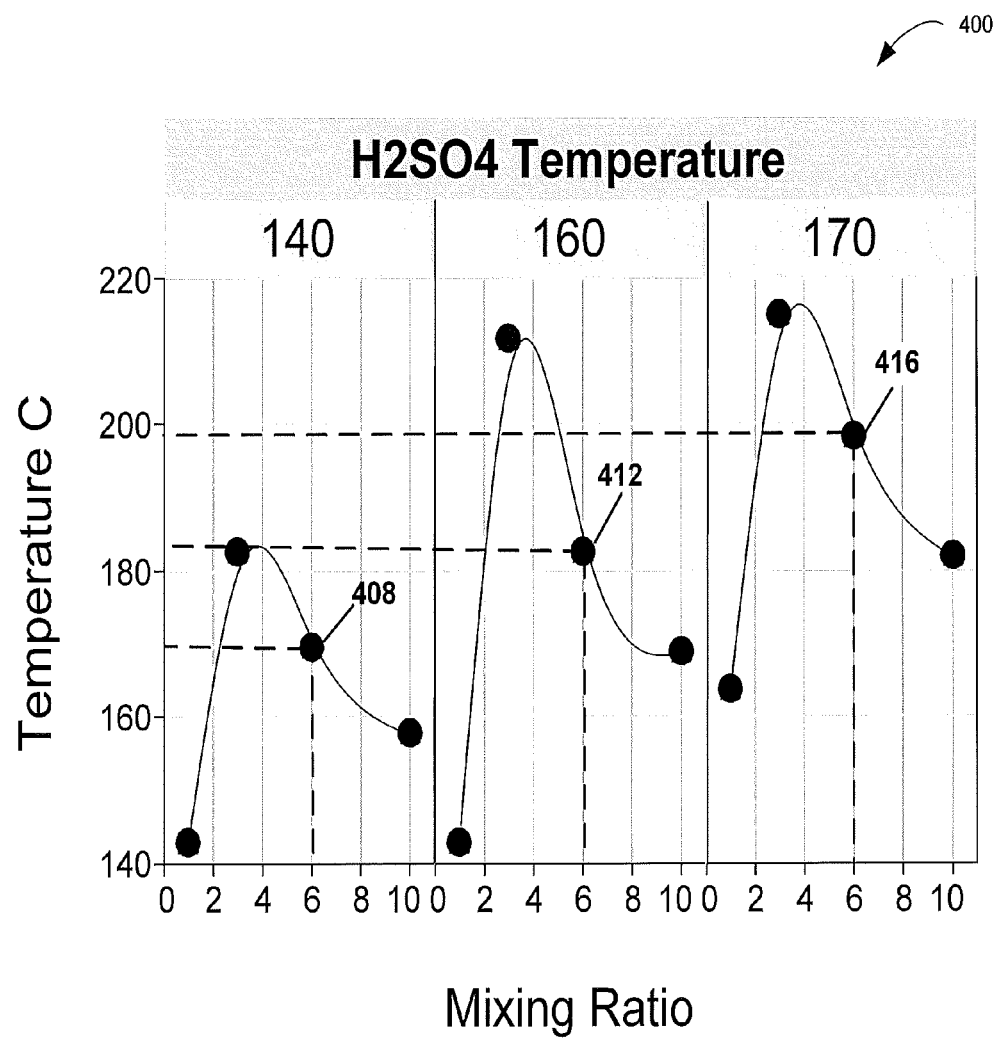
FIG. 3A is an exemplary graph of the mixing ratio of sulfuric acid and hydrogen peroxide versus the temperature of the resulting treatment liquid for three different temperatures of the input sulfuric acid.

FIG. 3A depicts a set of exemplary graphs of the mixing ratio of sulfuric acid and hydrogen peroxide versus the temperature of the resulting treatment liquid for three different temperatures of the input sulfuric acid. It is understood that two or more stripping chemicals may be used to achieve the objectives of the strip process. The set of graphs 400 shows the variability of the temperature of the treatment liquid based on the stripping chemicals used and the mixing ratios of the different stripping chemicals. Referring to FIG. 3A, the strip chemistry uses SPM that includes sulfuric acid as the primary stripping chemical at a primary temperature, hydrogen peroxide as the secondary stripping chemical at a secondary temperature, and sulfuric acid as a tertiary stripping chemical at a tertiary temperature. It should be noted that other combinations of stripping chemicals can also be used.

Referring to FIG. 3A graph for SPM, mixing ratios starting from 1:1 to 10:1 of the primary stripping chemical, sulfuric acid in this example, to the secondary stripping chemical, hydrogen peroxide, are shown for a primary temperature of sulfuric acid at 140 degrees C. With the input sulfuric acid temperature at 140 degrees C. and a mixing ratio of 6:1, the temperature of the treatment liquid, SPM, is about 170 degrees C., 408; at an input sulfuric acid temperature at 160 degrees C. and a mixing ratio of 6:1, the temperature of the treatment liquid, SPM, is about 183 degrees C., 412; and at an input sulfuric acid temperature at 170 degrees C. and a mixing ratio of 6:1, the temperature of the treatment liquid, SPM, is about 198 degrees C., 416. Even for the same mixing ratio of primary to secondary stripping chemical, the temperature of the treatment liquid using the SPM chemistry increases when the primary temperature of the primary stripping chemical is increased. The graph in FIG. 3A reinforces the effect of input acid temperature in determining liquid treatment temperature after mixing of the primary and secondary stripping chemicals.

Figure 3B:
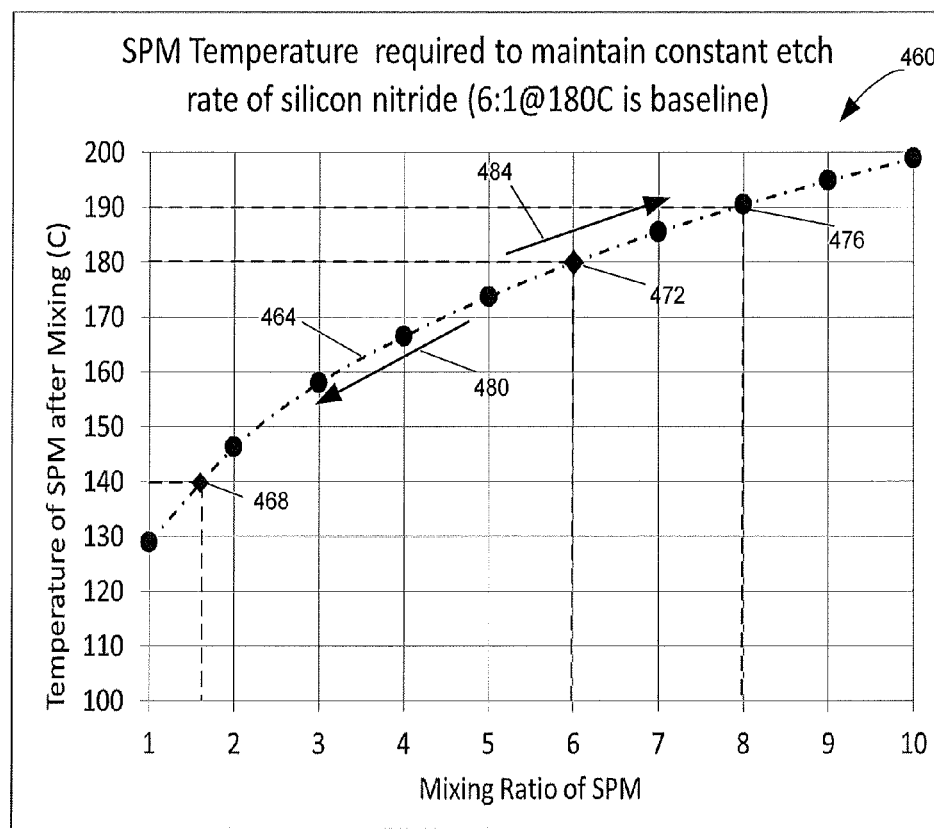
FIG. 3B is an exemplary graph of the mixing ratio of the SPM as a function of the temperature of the SPM after mixing where the graph displays the temperature required to maintain a constant silicon nitride etch rate (ER).

FIG. 3B is an exemplary graph 460 of the mixing ratio of SPM as function of the temperature of the SPM after mixing where the graph 460 displays the temperature required to maintain a constant silicon nitride etch rate (ER). Three mixing data points, (476, 472, and 468), are used to highlight in curve 464, which shows the difference in treatment liquid temperature (in this example, SPM temperature), required to maintain a constant silicon nitride etch rate where the 6:1 mixing ratio, point 472, is used as a baseline. When the mixing ratio of the SPM is 6:1 point 472, the temperature of the SPM after mixing is approximately 180 degrees C. When higher mixing ratios are used as indicated by the upward slanting arrow 484, higher temperatures are required to maintain the same silicon nitride etch rate. For example, when a mixing ratio of 8:1, point 476, is used, the temperature required to maintain the same silicon nitride etch rate is about 190 degrees C. When lower mixing ratios are used as indicated by downward slanting arrow 480, lower temperatures are required to maintain the same silicon nitride etch rate. For example, when a mixing ratio of 1.6:1.0, point 468, is used, the temperature required to maintain the same silicon nitrite etch rate is about 140 degrees C.

Figure 4A:
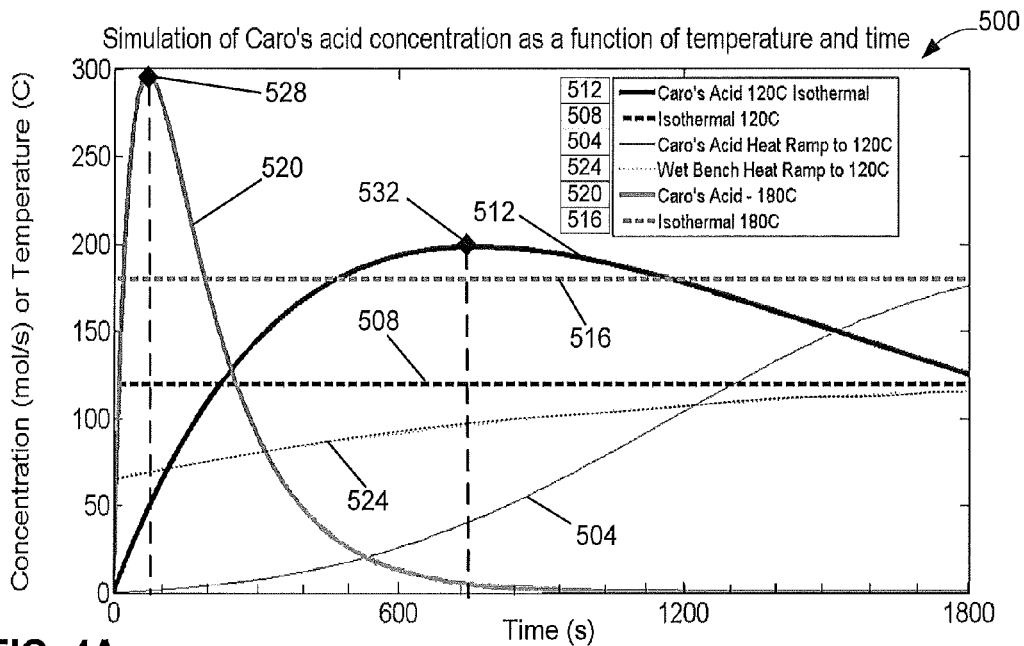
FIG. 4A depicts an exemplary graph of the simulated concentration of Caro's acid as a function of temperature and time in the sulfuric acid hydrogen peroxide mixture (SPM).

FIG. 4A depicts an exemplary graph 500 of the calculated concentration of Caro's acid as a function of temperature and time of the sulfuric acid hydrogen peroxide mixture (SPM). Calculation of Caro's acid concentration is necessary because the Caro's acid concentration cannot be practically measured in real time with current technology. Three sets of curves shall be highlighted to depict the effect of preheating the sulfuric acid before or after the stripping chemicals are mixed. The set of curves are also referred to as concentration or temperature profiles of the treatment liquid in the reaction zone. The first set of curves describes keeping the SPM at a constant temperature of 120 C. Curve 508, bold dotted line, shows the constant 120C temperature used to calculate the concentration of Caro's acid shown by curve 512, solid bold line, which shows a peak concentration of Caro's acid is reached at 710 seconds, 532. In contrast, the second set of curves, 504, thin solid line, and 524, thin dotted line, have the SPM starting at a temperature of 70 C and slowly approaching the maximum temperature of 120 C after 1800 seconds (outside the graph range). With the lower initial starting temperature the corresponding Caro's acid concentration, 504, does not reach a maximum until after 1800 seconds (outside the graph range). These two sets of curves demonstrate the value of pre-heating the sulfuric acid to higher temperatures prior to mixing with hydrogen peroxide. With the third pair of curves, (520, solid regular line and 516, dotted regular line), the pre-heat temperature of the sulfuric acid is shown in the first curve, labeled "Caro's Acid—180 C", 516 at 180 degrees C. The second curve, labeled "Caro's Acid 180 C", 520, reaches the maximum concentration of Caro's acid in about 80 seconds, 528. The time needed to reach peak concentration of Caro's acid is significantly reduced by increasing the temperature of the SPM from 120 C to 180 C. The higher temperature and associated shorter time to reach maximum Caro's acid concentration and higher strip rate is a requirement for cost effective single substrate processing.

Figure 4B:
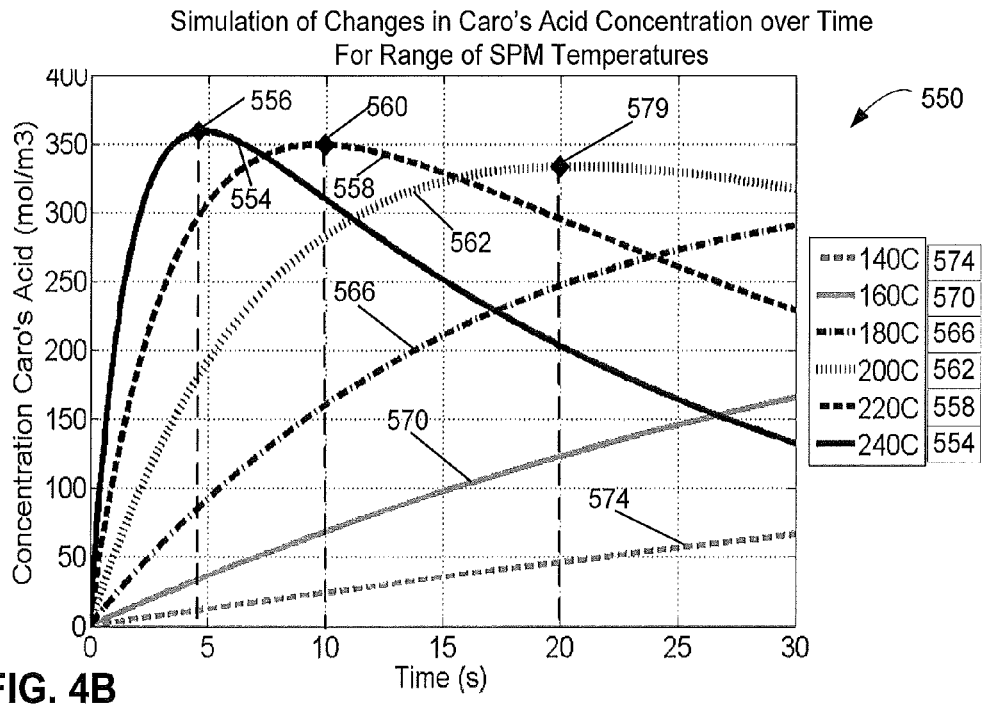
FIG. 4B depicts an exemplary graph comparing the simulation of Caro's acid concentration over time for a range of isothermal SPM temperatures.

FIG. 4B depicts an exemplary graph 550 of a calculation of changes in Caro's acid concentration over time for a range of SPM temperatures. The curves, 554, 558, 562, 566, 570, and 574, start at the beginning of the reaction to 30 seconds, showing the peak concentration of Caro's acid if it is within the time range. For the temperature range from 140 degrees C. to 180 degrees C., the peak concentration of Caro's acid took longer than 30 seconds and is outside the range of the graph. At a temperature of 200 degrees C., the maximum concentration of Caro's acid occurred at about 20 seconds, point 579. At a temperature of 220 degrees C., the maximum concentration of Caro's acid occurred at about 10 seconds, point 560. At a temperature of 240 degrees C., the maximum concentration of Caro's acid occurred at about 9 seconds, point 556. Successively higher temperatures of the SPM produced a peak in the temperature of Caro's acid in less time. The curves are also referred to as concentration or temperature profiles of the treatment liquid during reaction in the reaction zone. However, it should be noted that the time required to reach peak concentration needs to be integrated and balanced with other objectives of the strip process such as strip selectivity. The magnitude of the peak concentration and time at which this occurs will change as a function of SPM mixing performance, SPM temperature, SPM mixing ratio and initial concentrations of sulfuric acid and hydrogen peroxide.

Figure 4C:
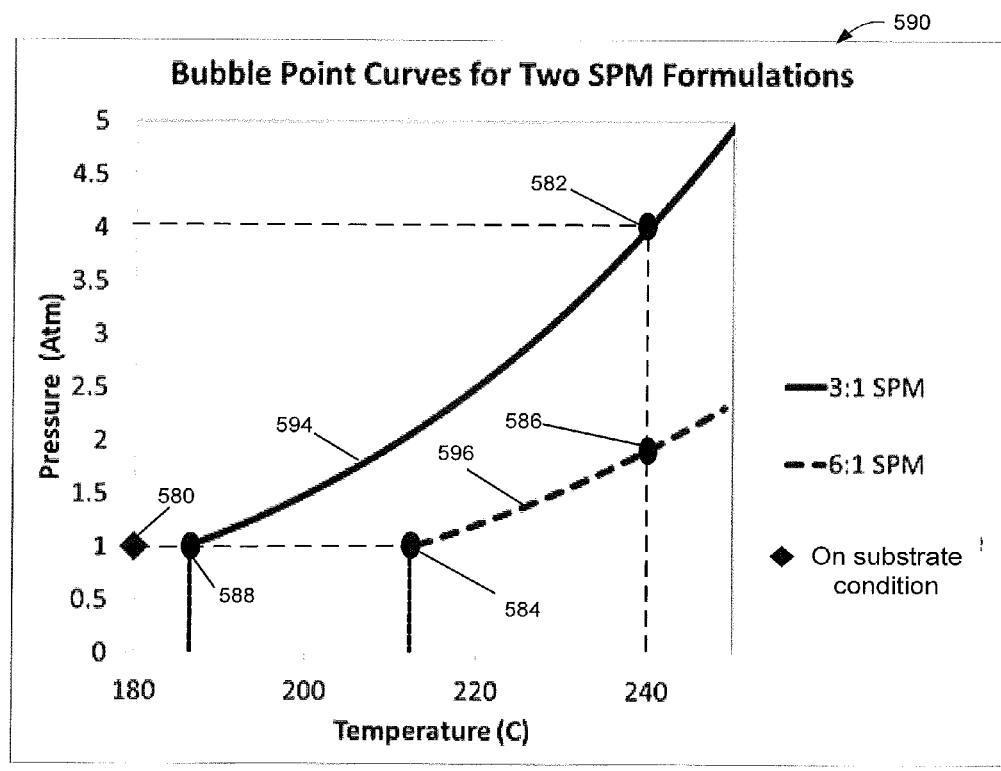
FIG. 4C depicts an exemplary graph of the SPM temperature as a function of pressure for different mixing ratios of sulfuric acid to hydrogen peroxide.

FIG. 4C depicts an exemplary graph 590 of the SPM temperature as a function of pressure for different mixing ratios of sulfuric acid to hydrogen peroxide. At a pressure of 1.0 atmosphere, the corresponding SPM temperature according to the boiling point curve 596 is about 213 degrees C., point 584, and goes up to about 240 degrees C. at about 1.8 atmospheres, point 586, for a mixing ratio of 6:1 sulfuric acid to hydrogen peroxide. Similarly, at a pressure of 1.0 atmosphere, the corresponding SPM temperature according to the boiling point curve 594 is about 186 degrees C., point 588, and goes up to about 240 degrees C. at about 4.1 atmospheres, point 582, for a mixing ratio of 3:1 sulfuric acid to hydrogen peroxide. If a regular non-pressurized processing chamber is used, the "On substrate condition" in the processing chamber is typically a pressure of 1.0 atmosphere and a temperature of about 180 degrees C., point 580. As mentioned above, the time needed to reach peak concentration of Caro's acid is a requirement of cost-effective strip processing, especially with single substrate processing.

Figure 5A:
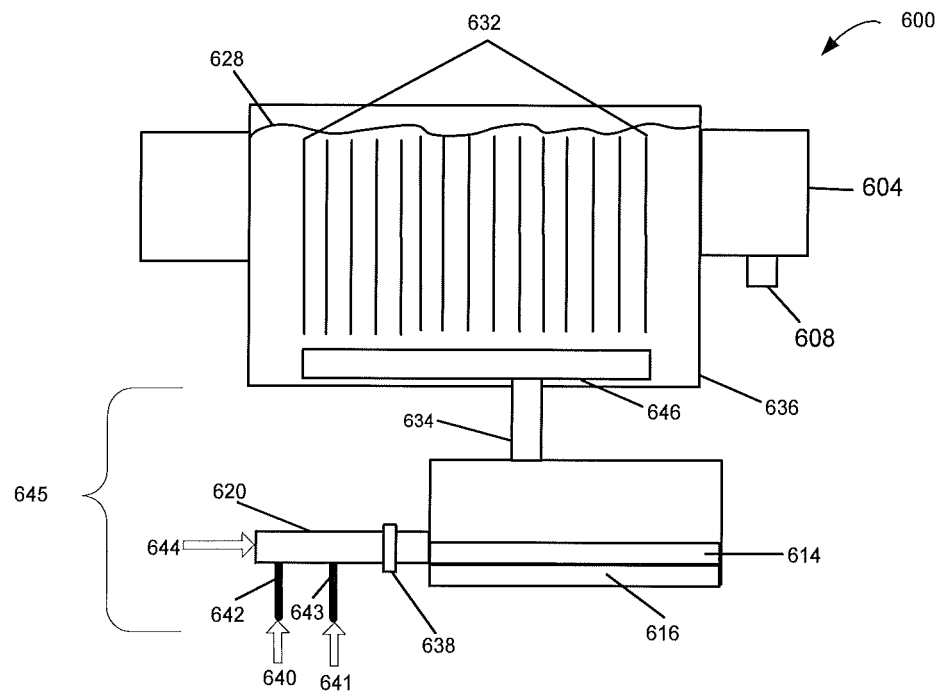
FIG. 5A depicts an exemplary schematic representation of a resist removal system for a plurality of substrates in batch processing, according to an embodiment of the present invention.

FIG. 5A depicts an exemplary schematic representation of a resist removal system 600 for a plurality of substrates in batch processing, according to an embodiment of the present invention. A resist removal system 600 comprises a processing chamber 636, a spill tank 604, spill drain 608, and a treatment liquid delivery system 645. The treatment liquid delivery system 645 comprises a mixing device 614, treatment liquid delivery line 634, a heater or cooler 616, a restriction 638, a principal treatment liquid supply line 620, a first injection line 642, and a second injection line 643. The restriction 638 can be a small diameter piping, pipe elbows, chokes, orifice meters, control valves, and the like. Substrates 632 are loaded into the processing chamber 636 using a substrate transfer system (not shown). A primary stripping chemical 644 is delivered through the principal treatment liquid supply line 620 to the mixing device 614 at a temperature referred to for convenience as the "primary temperature". A secondary stripping chemical 640 is injected into the treatment liquid supply line 620 using the first injection line 642 where the secondary stripping chemical is at a temperature referred to for convenience as the "secondary temperature". A tertiary stripping chemical 641 is injected into the principal treatment liquid supply line 620 using the second injection line 643 where the tertiary stripping chemical 641 is at a temperature referred to for convenience as the "tertiary temperature".

The primary, secondary, and tertiary stripping chemicals in various combinations in the flow are referred to as treatment liquid, and the treatment liquid is delivered to the mixing device 614 where the heater or cooler 616 can be used to adjust the temperature of the treatment liquid. Reactions between the primary, secondary, and tertiary stripping chemicals occur upon mixing in the principal treatment liquid supply line 620 and in the mixing device 614. The treatment liquid from the mixing device 614 is delivered to the processing chamber 636 through treatment liquid delivery line 634 using one or more dispensing devices 646. Referring to FIG. 5A, the one or more dispensing devices 646 can be nozzles positioned at the bottom and/or the sides of the processing chamber 636, thus providing further mixing of the treatment liquid 628 to assist in ensuring uniform stripping of the substrates.

Referring to FIG. 5A, the secondary stripping chemical 640 can be injected with a first mixing ratio of the primary stripping chemical 644 to secondary stripping chemical 640. The tertiary stripping chemical 641 can be injected with a second mixing ratio of the primary stripping chemical 644 to secondary stripping chemical 640. The first mixing ratio can be 3:1 and the second mixing ratio can be 6:1; other first and second mixing ratios can also be used. The primary stripping chemical 644 can be an acid at a primary temperature, the secondary stripping chemical 640 can be an oxidizer at a secondary temperature, and the tertiary stripping chemical 641 can be the same acid as the primary stripping chemical at a tertiary temperature. Furthermore, the acid in the primary stripping chemical 644 can be sulfuric acid at a temperature greater than 180 degrees C., the secondary stripping chemical 640 can be hydrogen peroxide at substantially 25 degrees C., and the tertiary stripping chemical 641 can be sulfuric acid at a temperature range from 25 degrees C. to 120 degrees C. The treatment liquid can have a temperature in the range of 140 degrees C. to 190 degrees C. when dispensed into the processing chamber 636. In an embodiment, the temperature of the treatment liquid may have dropped below a desired level after the primary and secondary stripping chemicals are mixed. Instead of sulfuric acid as the tertiary stripping chemical, water or steam can be used which will increase the temperature of the treatment liquid to the desired dispense temperature. Alternatively, the treatment liquid may be heated up with an inline or external heater to get the desired dispense temperature.

In another embodiment, other primary and secondary stripping chemicals can be used such as sulfuric acid and ozone, sulfuric acid and nitric acid, or nitric acid and hydrochloric acid where the tertiary stripping chemical is optional. In still another embodiment, combinations of a primary, secondary, and tertiary stripping chemicals include hydrofluoric acid, nitric acid, and acetic acid. Similarly, various standard clean combinations, for example SC1 and standard cleaning 2 (SC2) compositions and the like can also be used. Furthermore, other first, second and/or third mixing ratios of the primary, secondary, and tertiary stripping chemicals can also be used.

Figure 5B:
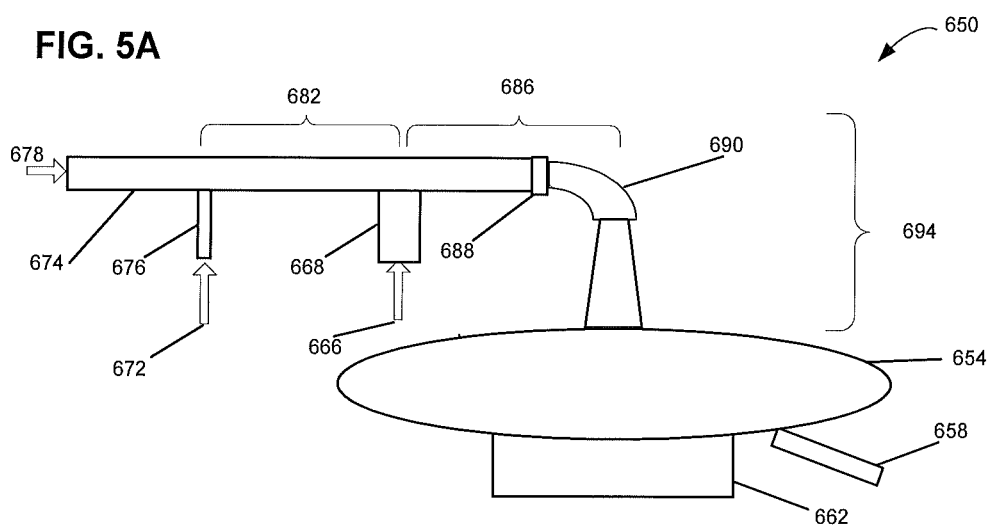
FIG. 5B depicts an exemplary schematic representation of a single substrate resist removal system according to an embodiment of the present invention.

FIG. 5B depicts an exemplary schematic representation of a single substrate resist removal system 650 according to an embodiment of the present invention. The single substrate resist removal system 650 comprises a substrate staging device 662, a substrate transfer system (not shown), a substrate heating system 658, and a treatment liquid delivery system 694, and a processing chamber (not shown). A substrate 654 is loaded into a processing chamber using the substrate transfer system. The substrate can be held stationary or rotated by the substrate staging device 662. A substrate heating system 658 can be used to pre-heat the substrate 654 or maintain a set temperature for the processing chamber. The treatment liquid delivery system 694 comprises a primary delivery line 674, first injection line 676, a second injection line 668, a restriction 688, and one or more dispensing devices 690. The restriction 688 in the dispensing device can be used to increase the back pressure in the treatment liquid 678 to prevent boiling of the treatment liquid 678 or bringing the treatment liquid 678 to a bubble point, prior to dispensing on a portion of the surface of the substrate 654. The restriction can be a small diameter piping, pipe elbows, chokes, orifice meters, control valves, and the like. Control of the temperature of input stripping chemicals, flow rates of injected stripping chemicals, back pressure, and use of an amount of temperature adjustment performed by temperature adjustment devices are controlled by a processor or by a control system (not shown).

Referring to FIG. 5B, a primary stripping chemical 678 is delivered through the treatment liquid supply line 674 at a primary temperature, concentration, and flow rate. A secondary stripping chemical 672 is injected onto the treatment liquid supply line 674 using a first injection line 676 where the secondary stripping chemical 672 is at a secondary temperature, concentration, and flow rate. A tertiary stripping chemical 666 is injected onto the treatment liquid supply line 674 using a second injection line 668 where the tertiary stripping chemical 666 is at a tertiary temperature, concentration, and flow rate. As mentioned above, the primary stripping chemical 678 or the combined primary, secondary, and tertiary stripping chemicals in various combinations plus reaction products in the treatment liquid supply line 674 is referred to as treatment liquid 678 and is dispensed onto a portion of the substrate 654 surface using one or more dispensing devices 690. The treatment liquid supply line 674 can have zones including a treatment liquid reaction zone 682 and treatment liquid temperature adjustment zone 686. The treatment liquid reaction zone 682 is a segment where reaction between the primary stripping chemical 644 and the secondary stripping chemical 640 occurs and where a peak concentration of reaction products are produced. In the treatment liquid temperature adjustment zone 686, the treatment liquid is brought to a target dispense temperature by the addition of the tertiary stripping chemical 666. In an embodiment, the tertiary stripping chemical may cause an exothermic reaction with the treatment liquid that serves to increase the treatment liquid temperature to the target dispense temperature. Alternatively, the tertiary stripping chemical may cause an endothermic reaction with the treatment liquid that serves to decrease the treatment liquid temperature to the target dispense temperature. In another embodiment, a cooling or heating device (not shown) can be used to bring the treatment liquid to the target dispense temperature. Control of the temperature of input stripping chemicals, flow rates of injected stripping chemicals, and use of an amount of temperature adjustment performed by temperature adjustment devices are controlled by a processor or by a control system (not shown).

Current practices in wet strip processing systems for nozzles typically utilize single-zone mixing nozzles. In the SPM application, use of the stage-mixing, for example, a dual-zone nozzle, decouples the Caro's acid generation from the dispense temperature of the treatment liquid. The present invention generates a high concentration of Caro's acid with the high temperature of the treatment liquid after mixing of the primary and secondary stripping chemicals. The treatment liquid is quenched with the additional application of sulfuric acid at a lower temperature in order to reach the target dispense temperature of the treatment liquid onto a surface of the substrate. As mentioned above, the temperature of the treatment liquid may have dropped below a desired level after the primary and secondary stripping chemicals are mixed, Instead of sulfuric acid as the tertiary stripping chemical, water or steam can be used to increase the temperature of the treatment liquid to the target dispense temperature.

Referring to FIG. 5B, injection of the secondary stripping chemical can have a first mixing ratio of primary stripping chemical 678 to secondary stripping chemical 672. Injection of the tertiary stripping chemical 666 can have a second mixing ratio of primary stripping chemical 678 to secondary stripping chemical 672. Alternatively, as mentioned above, the tertiary stripping chemical 666 may not be used. Furthermore, the temperature adjustment can be performed using inline or external coolers or heaters. The primary stripping chemical 678 can be an acid at a primary temperature, the secondary stripping chemical 672 can be an oxidizer at a secondary temperature, and the tertiary stripping chemical 666 can be the same acid as the primary stripping chemical at a tertiary temperature. In an embodiment, the acid in the primary stripping chemical 678 can be sulfuric acid at a temperature greater than 180 degrees C., the secondary stripping chemical 672 can be hydrogen peroxide at substantially 25 degrees C., and the tertiary stripping chemical 666 can be sulfuric acid at a temperature range from 25 degrees C. to 120 degrees C., referred to below as the SPM application. The first mixing ratio can be 3:1 and the second mixing ratio can be 6:1. The treatment liquid of the SPM application can have a temperature in the range of 140 degrees C. to 190 degrees C. when dispensed onto a portion of the substrate 654 surface.

In the SPM application, the treatment liquid reaction zone 682 is where most of the Caro's acid and radicals are generated. In the single substrate resist removal system 650 using sulfuric acid and hydrogen peroxide, the residence time of the treatment liquid in the primary delivery line 674 is a key factor in reaching the peak concentration of Caro's acid and radicals. Resist strip performance is a function of the peak mixing temperature and the dispense temperature of the treatment liquid. The dispense temperature is a function of peak mixing temperature, the first mixing ratio, and the second mixing ratio. The selectivity of stripping the resist strip over etching of the silicon nitride and silicon dioxide is a function of the dispense temperature and the second mixing ratio.

As mentioned above, other combinations of primary, secondary and an optional tertiary stripping chemical may be combined to achieve the target mixing temperature and dispense temperature of the treatment liquid. In an embodiment, control of the temperature of input stripping chemicals, flow rates of injected stripping chemicals, and use and amount of temperature adjustment created by the temperature adjustment devices are controlled by a processor (not shown).

Figure 6:
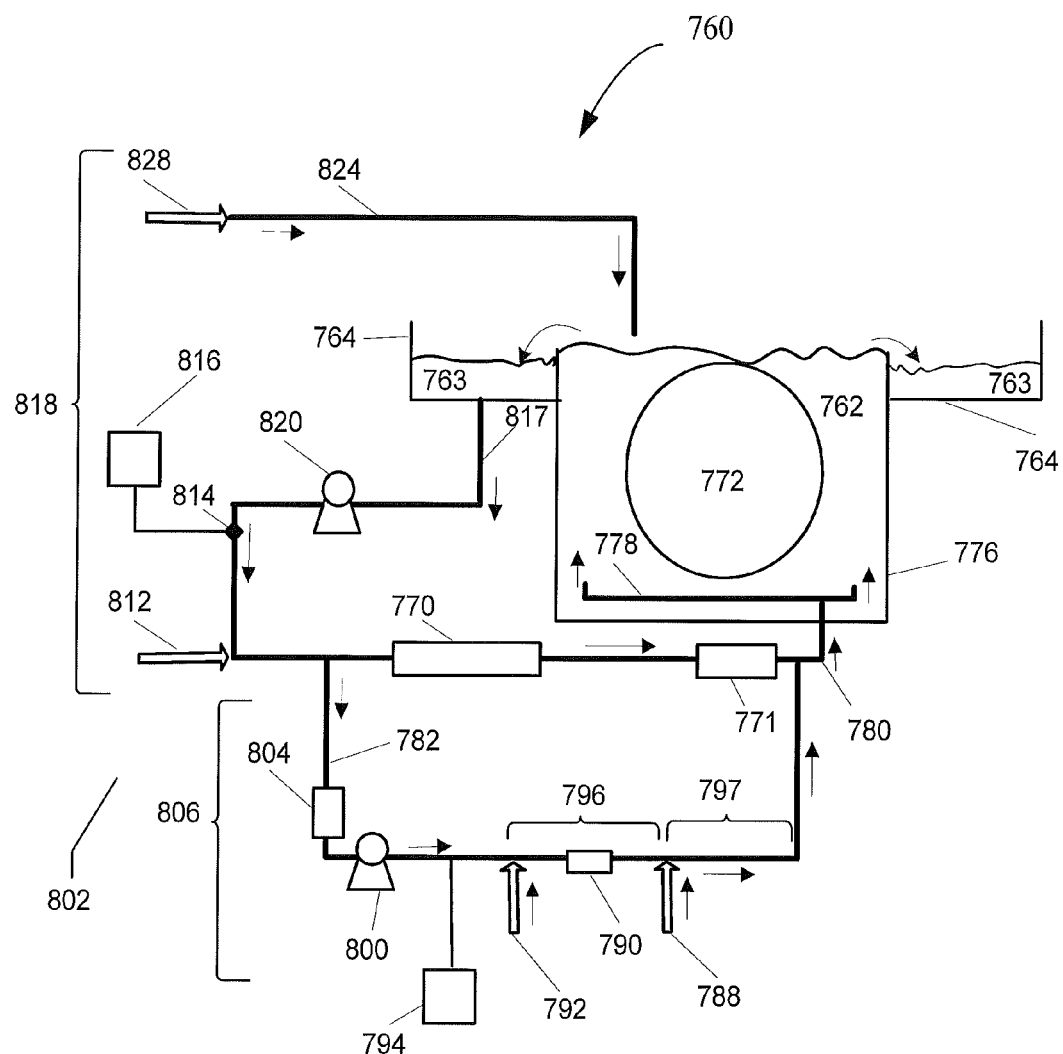
FIG. 6 is an exemplary schematic representation of a batch resist removal system with treatment liquid recirculation according to an embodiment of the present invention.

FIG. 6 is an exemplary schematic representation of a batch resist removal system 760 with treatment liquid recirculation according to an embodiment of the present invention. The batch resist removal system 760 comprises a processing chamber 776 and a recirculation system 802. The recirculation system 802 comprises the recycle sub-system 818 and a bypass sub-system 806. In an embodiment, an initial amount of treatment liquid 762 is delivered into the processing chamber 776 where the substrates 772 are subsequently positioned for batch strip processing. Delivery of the treatment liquid 762 can be done by recycling the treatment liquid 762 from a previous batch or by adding the primary, secondary, and tertiary stripping chemicals into the processing chamber 776 according to applicable mixing ratios. Recycling of treatment liquid 762 reduces the cost of the strip processing and is implemented by controlling the flow rates and application of heat in the heaters of the recirculation system 802.

In one embodiment, the treatment liquid 762 overflows into an overflow container 764 and becomes the recycled treatment liquid 763 that is pumped by recirculating pump 820 through the recycle line 817. The recycled treatment liquid 763 can be heated up using an inline heater or cooler 770, and filtered by filter 771 prior to being delivered into the processing chamber 776 using delivery line 780 and dispense device 778. The dispense device 778 can be a set of nozzles at the bottom and/or at the sides of the processing chamber 776. In another embodiment, in order to maintain the first and/or or second mixing ratio, a secondary stripping chemical can be injected using an injection device 812 based on measurements conducted with a ratio monitor and control system 816 for measuring and controlling the first and/or second mixing ratio. Alternatively, the secondary stripping chemical can be delivered into the processing chamber 776 via supply line 824 from the top of the processing chamber 776. The amount of the secondary stripping chemical can be based on the measurements conducted with the ratio monitor and control system 816.

Referring still to FIG. 6, a portion of the recycled treatment liquid 763 is directed to the bypass sub-system 806 comprising a bypass line 782, an optional bypass heater or cooler 804, a bypass pump 800, a secondary stripping chemical injection device 792, temperature monitor and control system 794, a mixing device 790, and a tertiary stripping chemical injection device 788. The optional bypass heater 804 can be located before the bypass pump 800 as indicated in FIG. 6 or after the bypass pump 800. In another embodiment, the optional bypass heater 804 can be located anywhere along the bypass line 782, for example, in the temperature adjustment zone 797. The mixing device 790, immediately proximate to the secondary stripping chemical injection device 792, can be a mechanical mixer or static mixer. Mechanical and static mixers for fluid mixing are well known to those in the art and can include stirrers, flow division mixers, radial mixing, magnetic mixers, constriction mixers, and the like. The temperature monitor and control system 794 measures the operating temperature of the treatment liquid at various point in the recirculation system 802 including at the beginning of the bypass line 782 and controls the heat generated in the optional bypass heater or cooler 804, the flow rate of the tertiary stripping chemical 788 in order to achieve the second mixing ratio of the primary stripping chemical to the secondary stripping chemical, and the dispense temperature of the treatment liquid 762 at dispense line 780 and through the dispense device 778.

Introduction of the secondary stripping chemical into the recirculation system 802 is controlled by the ratio monitor and control system 816 and is based on various measured mixing ratios of the primary stripping chemical to the secondary stripping chemical. One measurement point is at a point 814 in the flow of the recycled treatment liquid 763. As mentioned above, the mixing ratio can be adjusted with injection of the secondary stripping chemical with injection device 812, injection device 792, and/or with supply injection device 828. There are two zones in the bypass line 782: the reaction zone 796 and the temperature adjustment zone 797. The reaction zone 796 is a segment where reaction between the primary stripping chemical and the secondary stripping chemical occurs and where a peak concentration of reaction products is produced. In the temperature adjustment zone 797, the treatment liquid is brought to a target dispense temperature by the addition of the tertiary stripping chemical at a tertiary temperature and a tertiary flow rate.

In one embodiment, if the desired second mixing ratio and the treatment liquid dispense temperature (at the point of delivery in the processing chamber) can be achieved, there is no need for injection of the tertiary stripping chemical. As mentioned above, in one embodiment, the primary stripping chemical is an acid and the secondary stripping chemical is an oxidizer, and the tertiary stripping chemical can be the same acid as the primary stripping chemical or a different chemical at a tertiary temperature. As also mentioned above, in another embodiment, the primary stripping chemical is sulfuric acid at a primary temperature, the secondary stripping chemical is hydrogen peroxide at a secondary temperature, and the tertiary stripping chemical is sulfuric acid at a tertiary temperature. As mentioned above, the temperature of the treatment liquid may have dropped below a desired level after the primary and secondary stripping chemicals are mixed. Instead of sulfuric acid as the tertiary stripping chemical, water or steam can be used to increase the temperature of the treatment liquid to the desired dispense temperature. Control of the temperature of input stripping chemicals, flow rates of injected stripping chemicals, and use and amount of heat/cooling created by the inline and bypass heaters or coolers, 770 and 804, for temperature adjustments can be controlled with a processor or by a control system (not shown).

Figure 7A:
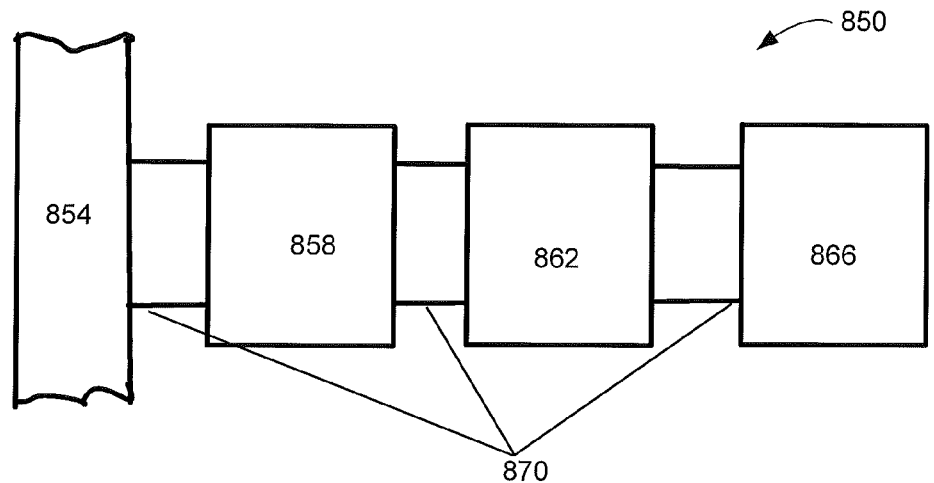
FIGS. 7A, 7B, and 7C are exemplary schematic representations of a transfer system for a resist removal system in several embodiments of the present invention.
Figure 7B:
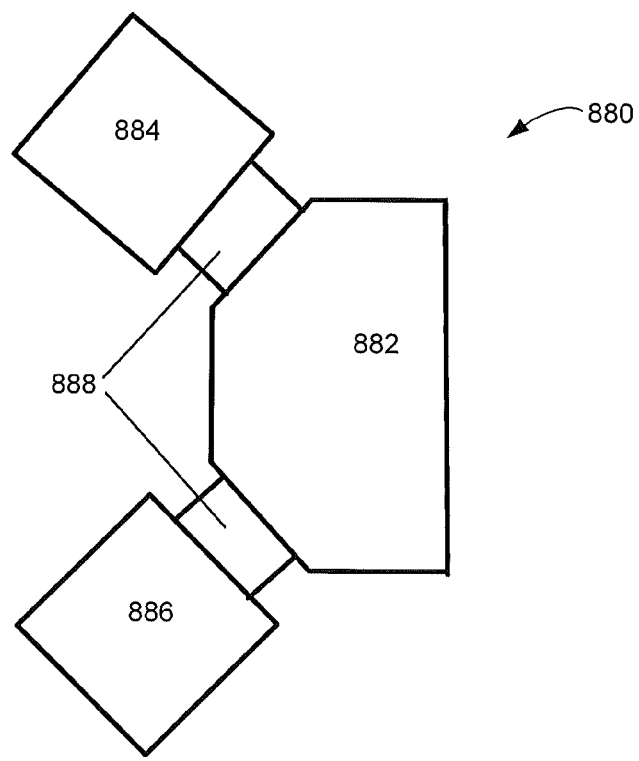
Figure 7C:
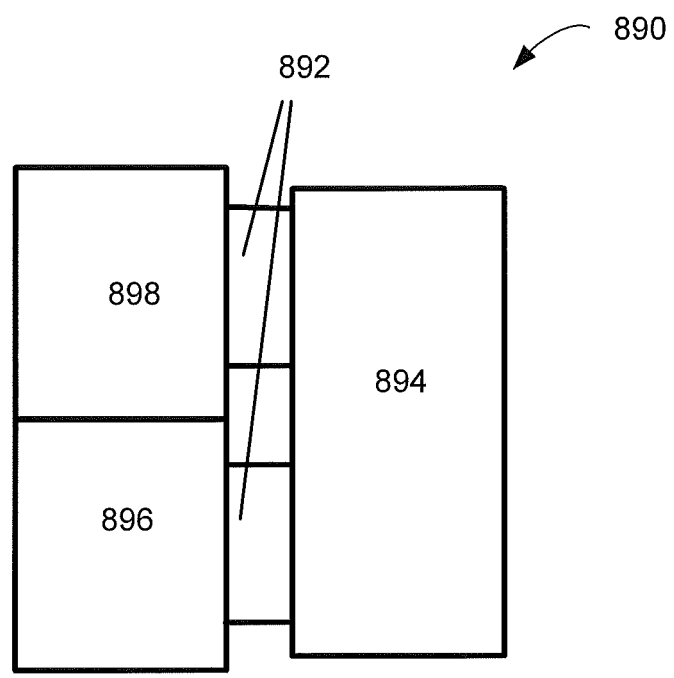

FIGS. 7A, 7B, and 7C are exemplary schematic representations of a transfer system for a resist removal system in several embodiments of the present invention. According to one embodiment, FIG. 7A depicts a processing system 850 for performing a non-plasma cleaning process on a substrate. The processing system 850 comprises a first treatment system 866, and a second treatment system 862 coupled to the first treatment system 866. For example, the first treatment system 866 can comprise a chemical treatment system, a resist removal system, (or chemical treatment component), and the second treatment system 862 can comprise a thermal treatment system (or thermal treatment component).

Also, as illustrated in FIG. 7A, a transfer system 858 can be coupled to the first treatment system 866 in order to transfer substrates into and out of the first treatment system 866 and the second treatment system 862, and exchange substrates with a multi-element manufacturing system 854. The first and second treatment systems 866, 862, and the transfer system 858 can, for example, comprise a processing element within the multi-element manufacturing system 854. For example, the multi-element manufacturing system 854 can permit the transfer of substrates to and from processing elements including such devices as etch treatment systems, deposition system, coating systems, patterning systems, metrology systems, etc. In order to isolate the processes occurring in the first and second systems, an isolation assembly 870 can be utilized to couple each system. For instance, the isolation assembly 870 can comprise at least one of a thermal insulation assembly to provide thermal isolation, and a gate valve assembly to provide vacuum isolation. Of course, treatment systems 866 and 862, and transfer system 858 can be placed in any sequence.

Alternately, in another embodiment, FIG. 7B presents a processing system 880 for performing a non-plasma cleaning process on a substrate. The processing system 880 comprises a first treatment system 884, and a second treatment system 886. For example, the first treatment system 884 can comprise a chemical treatment system, and the second treatment system 886 can comprise a thermal treatment system.

Also, as illustrated in FIG. 7B, a transfer system 882 can be coupled to the first treatment system 884 in order to transfer substrates into and out of the first treatment system 884, and can be coupled to the second treatment system 886 in order to transfer substrates into and out of the second treatment system 886. Additionally, transfer system 882 can exchange substrates with one or more substrate cassettes (not shown). Although only two process systems are illustrated in FIG. 7B, other process systems can access transfer system 882 including such devices as resist removal systems, etch treatment systems, deposition systems, coating systems, patterning systems, metrology systems, etc. In order to isolate the processes occurring in the first and second systems, an isolation assembly 888 can be utilized to couple each system. For instance, the isolation assembly 888 can comprise at least one of a thermal insulation assembly to provide thermal isolation, and a gate valve assembly to provide vacuum isolation. Additionally, for example, the transfer system 882 can serve as part of the isolation assembly 888.

Alternately, in another embodiment, FIG. 7C presents a processing system 890 for performing a non-plasma cleaning process on a substrate. The processing system 890 comprises a first treatment system 898, and a second treatment system 896, wherein the first treatment system 898 is stacked atop the second treatment system 896 in a vertical direction as shown. For example, the first treatment system 898 can comprise a chemical treatment system, and the second treatment system 896 can comprise a thermal treatment system.

Also, as illustrated in FIG. 7C, a transfer system 894 can be coupled to the first treatment system 898 in order to transfer substrates into and out of the first treatment system 898, and can be coupled to the second treatment system 896 in order to transfer substrates into and out of the second treatment system 896. Additionally, transfer system 894 can exchange substrates with one or more substrate cassettes (not shown). Although only two process systems are illustrated in FIG. 7C, other process systems can access transfer system 894 including such devices as resist removal systems, etch treatment systems, deposition systems, coating systems, patterning systems, metrology systems, etc. In order to isolate the processes occurring in the first and second systems, an isolation assembly 892 can be utilized to couple each system. For instance, the isolation assembly 892 can comprise at least one of a thermal insulation assembly to provide thermal isolation, and a gate valve assembly to provide vacuum isolation. Additionally, for example, the transfer system 894 can serve as part of the isolation assembly 892. As illustrated above, the chemical treatment system and the thermal treatment system may comprise separate process chambers coupled to one another. Alternatively, the chemical treatment system and the thermal treatment system may be a component of a single process chamber.

Figure 8:
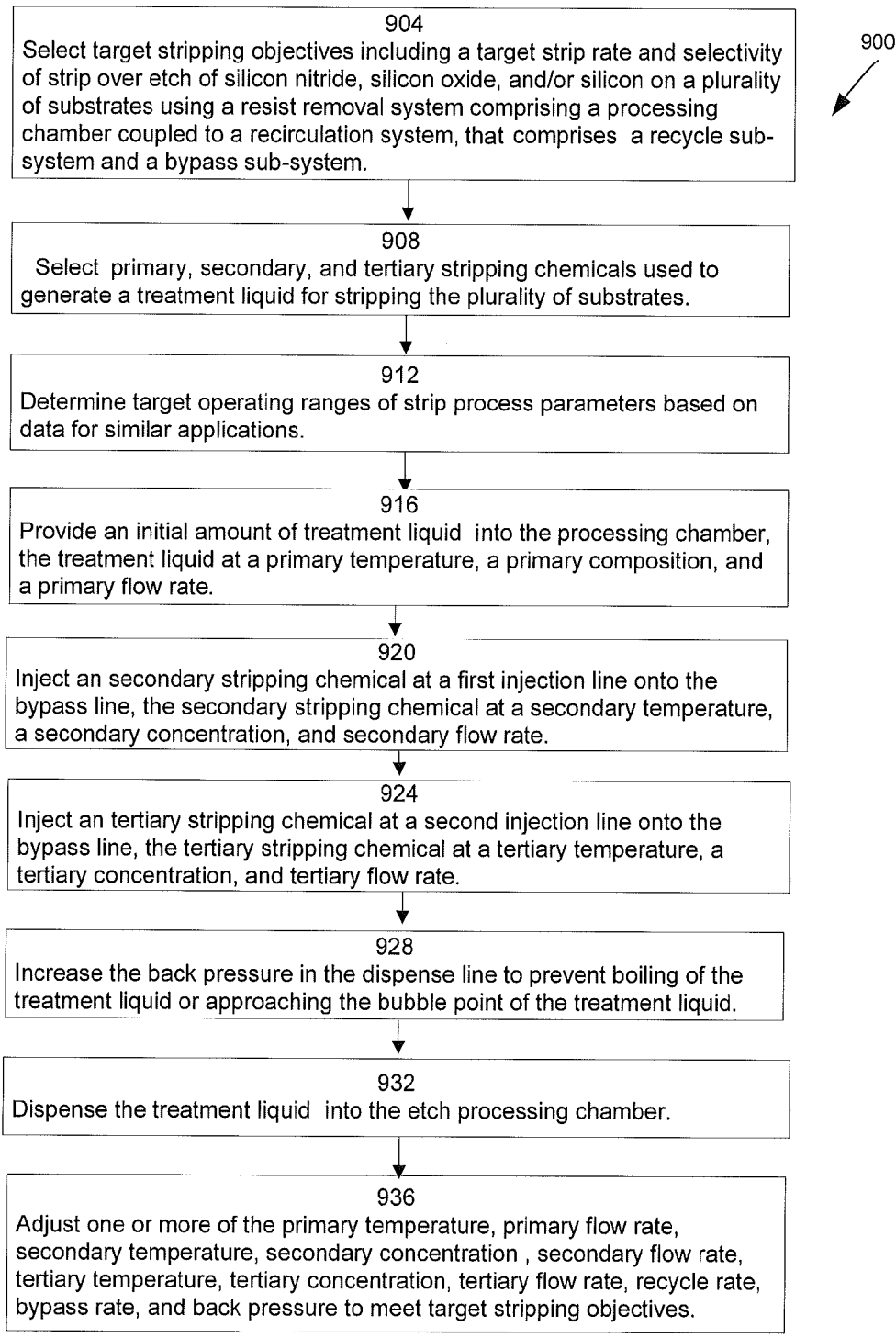
FIG. 8 is an exemplary flowchart for a method for enhancing strip rate and selectivity for strip over etch of silicon nitride and silicon oxide on a plurality of substrates using a batch resist removal system in an embodiment of the present invention.

FIG. 8 is an exemplary flowchart for a method 900 for enhancing strip rate and selectivity for strip over etch of silicon nitride or silicon dioxide on a plurality of substrates using a batch resist removal system in an embodiment of the present invention. The batch resist removal system comprises a processing chamber coupled to a recirculation system. From the detailed description of FIG. 6, the recirculation system 802 comprises a recycle sub-system 818 and a bypass sub-system 806, the bypass sub-system 806 comprising a bypass line 782, an optional bypass heater 804, a bypass pump 800, a secondary stripping chemical injection device 792, temperature monitor and control system 794, a mixing device 790, and a tertiary stripping chemical injection device 788. Referring to FIG. 8, in operation 904, one or more target stripping objectives, for example, strip rate and selectivity for strip over etch of silicon nitride and silicon oxide, are selected. The strip rate can be expressed as nanometers (nm) per minute, for example, 1,000 nm/min., or a range, for example, 50 to 1,250 nm/min. The selectivity for strip over etch of nitride or silicon dioxide can be 0.1 Å (Angstrom) of silicon and oxide loss on polysilicon blanket test wafers per lightly doped drain (LDD) clean step and silicon nitride loss per LDD clean step. Similarly, a range of selectivity targets, for example, 0.07 to 0.15 Å, can be used. In operation 908, primary, secondary, and tertiary stripping chemicals are selected to generate a treatment liquid for stripping the plurality of substrates. In operation 912, target operating ranges of strip parameters are determined, based on data for similar applications. Strip parameters can include one or more flow rates, input temperatures, and concentrations of the primary, secondary, and tertiary stripping chemicals, percentage of recycled treatment liquid, percentage of bypass treatment liquid, the dispense temperature, back pressure in the supply line, and the like.

In operation 916, an initial amount of treatment liquid is provided and placed in the processing chamber where the treatment liquid is at a primary temperature and primary composition. The initial amount of treatment liquid can be from a previous batch or generated by adding the primary, secondary, and tertiary stripping chemicals into the processing chamber according to applicable mixing ratios. In operation 920, the secondary stripping chemical is injected at a first injection line onto the bypass line where the secondary stripping chemical is at a secondary temperature, a secondary concentration, and a secondary flow rate. In operation 924, the tertiary stripping chemical is injected at a second injection line into the bypass line where the tertiary stripping chemical is at a tertiary temperature, a tertiary concentration, and a tertiary flow rate. In operation 928, the back pressure in the treatment liquid supply delivery line is adjusted to prevent boiling or approaching the bubble point of the dispensed treatment liquid. In operation 932, the treatment liquid is dispensed in the processing chamber at a dispense temperature. In one embodiment, dispense can be performed using nozzles at the bottom and sides of the processing chamber. In operation 936, one or more of the primary temperature, primary flow rate, secondary temperature, secondary flow rate, secondary concentration, tertiary temperature, tertiary concentration, recycle percent, bypass percent, and back pressure are adjusted to meet the target stripping objectives. Recycle percent is the percentage of treatment liquid recycled to the recirculation system compared to the treatment liquid dispense rate. Bypass percent is the percentage of the bypass treatment liquid compared to the recycled treatment liquid. Control of the temperature of input stripping chemicals, flow rates of injected stripping chemicals, and use and amount of heat created by the inline and bypass heaters, or coolers for temperature adjustments can be controlled with a processor or by a control system (not shown).

With reference to operation 936, the ratio monitor and control system, (FIG. 6, 816), can be used to monitor and control the ratio of primary stripping chemical to the secondary stripping chemical by adjusting the flow rates to meet the desired first mixing ratio. The ratio monitor and control system (FIG. 6, 816), can also be used to monitor and control the ratio of primary stripping chemical to the secondary stripping chemical to meet the desired second mixing ratio by adjusting the flow rate of the tertiary stripping chemical. Similarly, the temperature monitor and control system, (FIG. 6, 794) is used to monitor the treatment liquid dispense temperature by adjusting the temperatures or flow rates of the first, second, and/or tertiary stripping chemicals. In another embodiment, the ratio monitor and control system (FIG. 6, 816), is used jointly with the temperature monitor and control system, (FIG. 6, 794) to monitor and control the first and second mixing ratios of primary stripping chemical to the secondary stripping chemical, and the dispense temperature of the treatment liquid by performing the adjustments of the strip process parameters mentioned above.

In the SPM application, the primary stripping chemical is sulfuric acid at a temperature of 180 degrees C. or higher and at a concentration range of 75 to 98 wt % and is used to generate the initial amount of treatment liquid placed in the processing chamber. As noted above, the initial amount of treatment liquid can be the treatment liquid used to process a previous batch of substrates. In one embodiment, the sulfuric acid can be 96 to 98 wt %. The secondary stripping chemical is hydrogen peroxide and is injected into the treatment liquid at substantially 25 degrees C., at a concentration of 30-35 wt % and a first mixing ratio by volume of sulfuric acid to hydrogen peroxide can be 3:1. Other first mixing ratios such as 1:1 or 4:1 can also be used. In operation 924, a tertiary stripping chemical is injected into the treatment liquid using a second injection line at a tertiary temperature and a second mixing ratio. The tertiary stripping chemical can be sulfuric acid at a temperature in the range of 25 to 120 degrees C. at a concentration range of 75 to 98 wt %. The second mixing ratio by volume of the sulfuric acid to hydrogen peroxide at the second injection line can be 6:1. Other second mixing ratios can be in the range 5:1 to 20:1. When the second mixing ratio is expressed as a ratio of sulfuric acid to the bypass treatment liquid, the second mixing ratio by volume can be substantially 4:1, equivalent to substantially 6:1 sulfuric acid to hydrogen peroxide. Other second mixing ratios for the SPM application and other applications can also be used. In an embodiment, the temperature of the treatment liquid may have dropped below a desired level after the primary and secondary stripping chemicals are mixed. Instead of sulfuric acid as the tertiary stripping chemical, water or steam can be used which will increase the temperature of the treatment liquid to the desired dispense temperature. Alternatively, the treatment liquid may be heated up with an inline or external heater or cooled by an inline or external cooler to get the desired dispense temperature.

Figure 9:
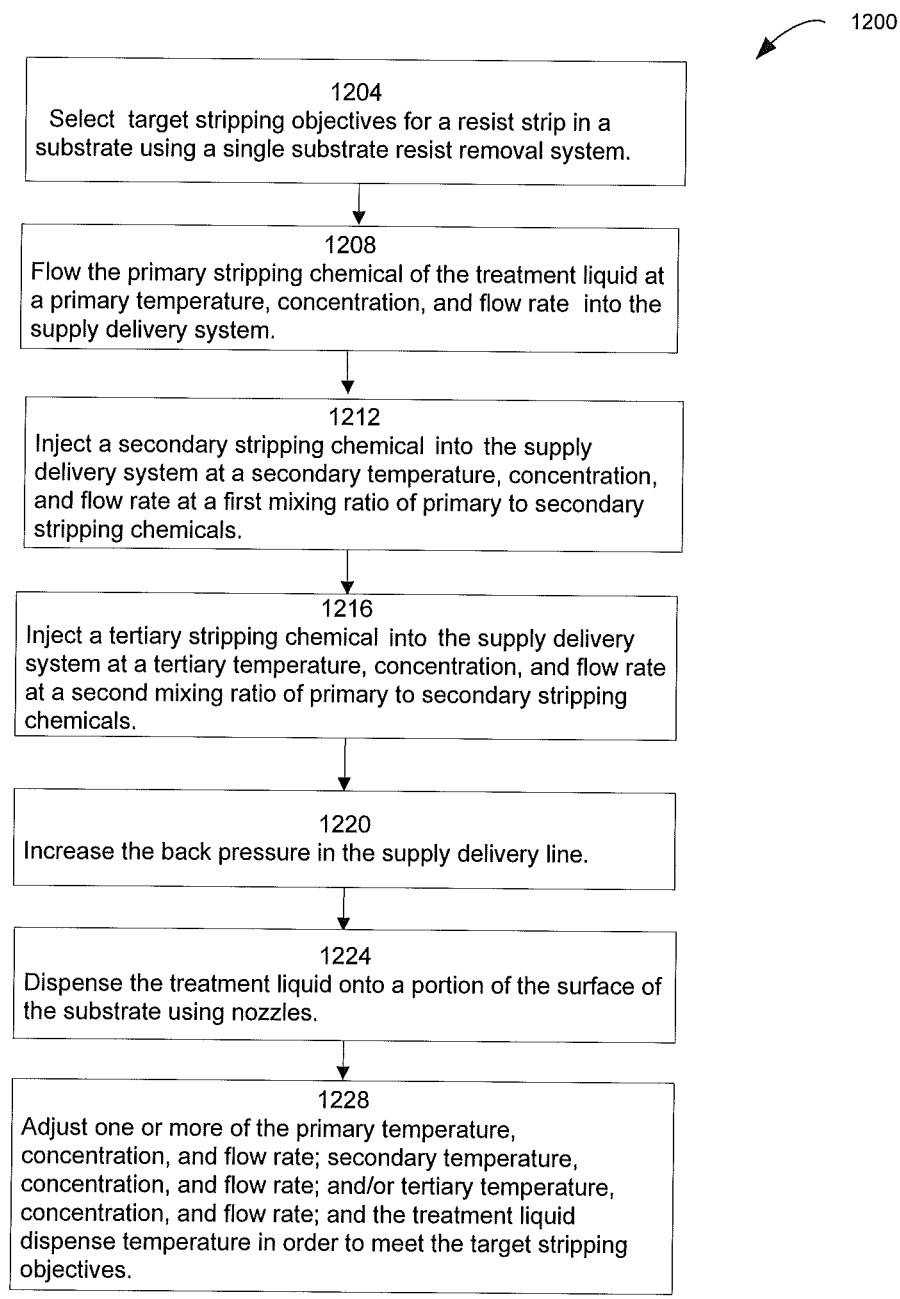
FIG. 9 is an exemplary flowchart for a method for increasing strip rate and selectivity for the strip over the etch of silicon nitride and silicon oxide in a single substrate resist removal system using a primary, secondary, and tertiary stripping chemicals in an embodiment of the present invention.

In operation 928, the pressure in the treatment liquid delivery system can be increased to prevent the treatment liquid from boiling or approaching the bubble point of the dispensed treatment liquid. In the SPM application, the pressure can be in a range from 1 atmosphere to about 3 atmospheres. As noted above, if back-pressure is utilized in the nozzle to reach higher reacting temperatures, adequate safety systems have to be put in place to protect people and equipment. The pressure can be increased using a restriction in the treatment liquid delivery system after the injection of the tertiary stripping chemical as shown in FIG. 5A, 638 or in FIG. 5B, 688. Other means such as valves or the like can be used to increase the pressure in supply delivery system FIG. 9 is an exemplary flowchart for a method 1200 for increasing strip rate and selectivity for strip over etch of nitride or silicon dioxide of a substrate for a single substrate resist removal system, using a primary, secondary, and tertiary stripping chemicals in an embodiment of the present invention. The single substrate resist removal system comprises a processing chamber and a treatment liquid delivery system. In operation 1204, a target strip rate for the resist and selectivity for strip over etch of nitride or silicon dioxide are selected. The strip rate can be 1,000 nm/min., or a range of, for example, 500 to 1,000 nm/min. The selectivity can be 0.1 Å (Angstrom) of silicon and oxide loss on polysilicon blanket test wafers per lightly doped drain (LDD) clean step and silicon nitride loss per LDD clean step. Similarly, a range of strip selectivity targets, for example, 0.07 to 0.15 Å, can be used. In operation 1208, the primary stripping chemical is flowed through the treatment liquid delivery system. For example, the primary stripping chemical can be sulfuric acid at a temperature above 180 degrees C. In operation 1212, a secondary stripping chemical is injected onto the treatment liquid delivery system using a first injection line where the secondary stripping chemical is at a secondary temperature and where the secondary stripping chemical is mixed with the primary stripping chemical at a first mixing ratio by volume.

In the SPM application for a single substrate strip removal system, the primary stripping chemical is sulfuric acid at a temperature of 180 degrees C. or higher and at a concentration range of 75 to 98 wt %. In one embodiment, the sulfuric acid can be 96 to 98 wt %. The secondary stripping chemical is hydrogen peroxide and is injected onto the treatment liquid at substantially 25 degrees C., at a concentration of 30-35 wt % and a first mixing ratio by volume of sulfuric acid to hydrogen peroxide can be 3:1. Other first mixing ratios such as 1:1 or 4:1 can also be used.

In operation 1216, a tertiary stripping chemical is injected onto the treatment liquid delivery system using a second injection line at a tertiary temperature and a second mixing ratio. The tertiary stripping chemical can be sulfuric acid at a temperature in the range of 25 to 120 degrees C. at a concentration range of 75 to 98 wt %. The second mixing ratio by volume of the sulfuric acid to hydrogen peroxide at the second injection line can be 6:1. Other second mixing ratios can be in the range 5:1 to 20:1. When the second mixing ratio is expressed as a ratio of sulfuric acid to the treatment liquid, the second mixing ratio by volume can be substantially 4:1, equivalent to substantially 6:1 sulfuric acid to hydrogen peroxide. Other second mixing ratios for the SPM application and other applications can also be used. In an embodiment, the temperature of the treatment liquid may have dropped below a desired level after the primary and secondary stripping chemicals are mixed, Instead of sulfuric acid as the tertiary stripping chemical, water or steam can be used which will increase the temperature of the treatment liquid to the desired dispense temperature. Alternatively, the treatment liquid may be heated up with an inline or external heater, or cooled by an inline or external cooler to get the desired dispense temperature.

In operation 1220, the pressure in the treatment liquid delivery system can be increased to prevent the treatment liquid from boiling or approaching the bubble point of the dispensed treatment liquid. As noted above, if back-pressure is utilized in the nozzle to reach higher reacting temperatures, adequate safety systems have to be put in place to protect people and equipment. The pressure can be increased using a restriction in the treatment liquid delivery system after the injection of the tertiary stripping chemical as shown in FIG. 5A, 638 or in FIG. 5B, 688. Other means such as valves or the like can be used to increase the pressure in supply delivery system. In operation 1224, the treatment liquid is dispensed onto a surface of substrate. In operation 1228, one or more of the primary temperature, primary flow rate, secondary temperature, secondary flow rate, secondary concentration, tertiary temperature, tertiary concentration, recycle percent, bypass percent, and back pressure are adjusted to meet the one or more target stripping objectives.

Figure 10:
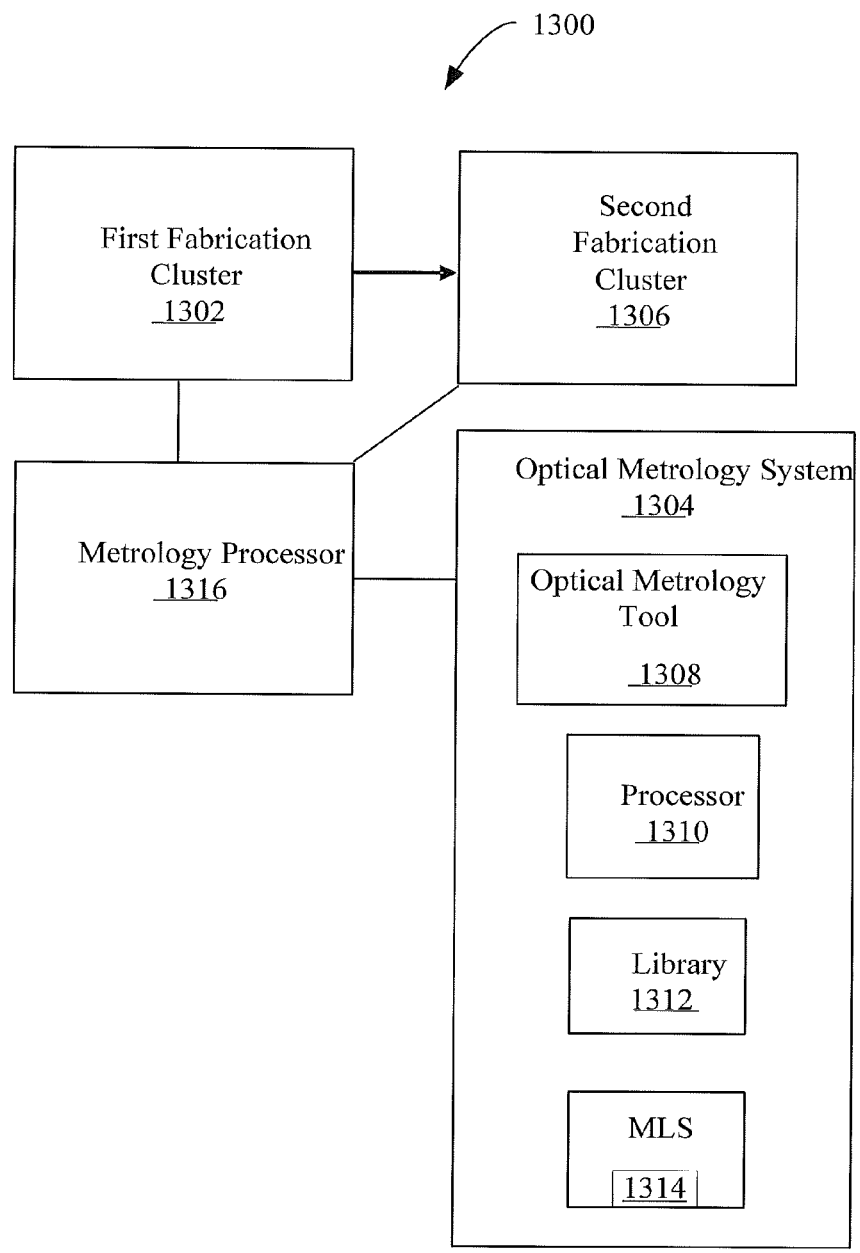
FIG. 10 is an exemplary block diagram of a system for determining and utilizing profile parameters of a structure on a substrate during or after resist removal processing where the profile parameter values are used for automated process and equipment control.

FIG. 10 is an exemplary block diagram of a system 1300 for determining and utilizing profile parameters of a structure on a substrate during or after strip processing where the profile parameter values are used for automated process and equipment control. System 1300 includes a first fabrication cluster 1302 and optical metrology system 1304. System 1300 also includes a second fabrication cluster 1306. For details of an optical metrology system used to determine profile parameters of a structure on a substrate, refer to U.S. Pat. No. 6,943,900, titled GENERATION OF A LIBRARY OF PERIODIC GRATING DIFFRACTION SIGNALS, issued on Sep. 13, 2005, which is incorporated herein by reference in its entirety. Although the second fabrication cluster 1306 is depicted in FIG. 10 as being subsequent to first fabrication cluster 1302, it should be recognized that second fabrication cluster 1306 can be located prior to first fabrication cluster 1302 in system 1300, for example, in the manufacturing process flow.

A photolithographic process, such as exposing and/or developing a photoresist layer applied to a substrate, can be performed using first fabrication cluster 1302. In one exemplary embodiment, optical metrology system 1304 includes an optical metrology tool 1308 and processor 1310. Optical metrology tool 1308 is configured to measure a diffraction signal off the structure. Processor 1310 is configured to use the measured diffraction signal measured by the optical metrology tool and adjust using a signal adjuster, generating an adjusted metrology output signal. Furthermore, processor 1310 is configured to compare the adjusted metrology output signal to the simulated diffraction signal. As mentioned above, the simulated diffraction is determined using an optical metrology tool model using ray tracing, a set of profile parameters of the structure and numerical analysis based on the Maxwell equations of electromagnetic diffraction. In one exemplary embodiment, optical metrology system 1304 can also include a library 1312 with a plurality of simulated diffraction signals and a plurality of values of one or more profile parameters associated with the plurality of simulated diffraction signals. As described above, the library can be generated in advance; metrology processor 1310 can compare an adjusted metrology output signal to the plurality of simulated diffraction signals in the library. When a matching simulated diffraction signal is found, the one or more values of the profile parameters associated with the matching simulated diffraction signal in the library is assumed to be the one or more values of the profile parameters used in the substrate application to fabricate the structure.

System 1300 also includes a metrology processor 1316. In one exemplary embodiment, processor 1310 can transmit the one or more values of the one or more profile parameters to metrology processor 1316. Metrology processor 1316 can then adjust one or more process parameters or equipment settings of the first fabrication cluster 1302 based on the one or more values of the one or more profile parameters determined using optical metrology system 1304. Metrology processor 1316 can also adjust one or more process parameters or equipment settings of the second fabrication cluster 1306 based on the one or more values of the one or more profile parameters determined using optical metrology system 1304. As noted above, second fabrication cluster 1306 can process the substrate before or after fabrication cluster 1302. In another exemplary embodiment, processor 1310 is configured to train machine learning system 1314 using the set of measured diffraction signals as inputs to machine learning system 1314 and profile parameters as the expected outputs of machine learning system 1314.

In another embodiment, the metrology processor 1316 receives one or more sensor measurement signals from the first fabrication cluster 1302. The sensor measurement signals can be from a processing system and can include concentrations of one or more stripping process chemicals or reaction products, flow rates of the stripping process chemicals or reaction products, a temperature of the treatment liquid at dispense in the processing chamber or the like. The sensor measurement signals by itself or in conjunction with the optical metrology signals can be used by the metrology processor 1316 to determine one or more profile parameters of the structure being stripped. Metrology processor 1316 can then adjust one or more process parameters or equipment settings of the first fabrication cluster 1302 or the second fabrication cluster 1306 based on the one or more values of the one or more profile parameters determined using the sensor measurement signals and/or in conjunction with the one or more profile parameters determined using optical metrology system 1304.

Figure 11:
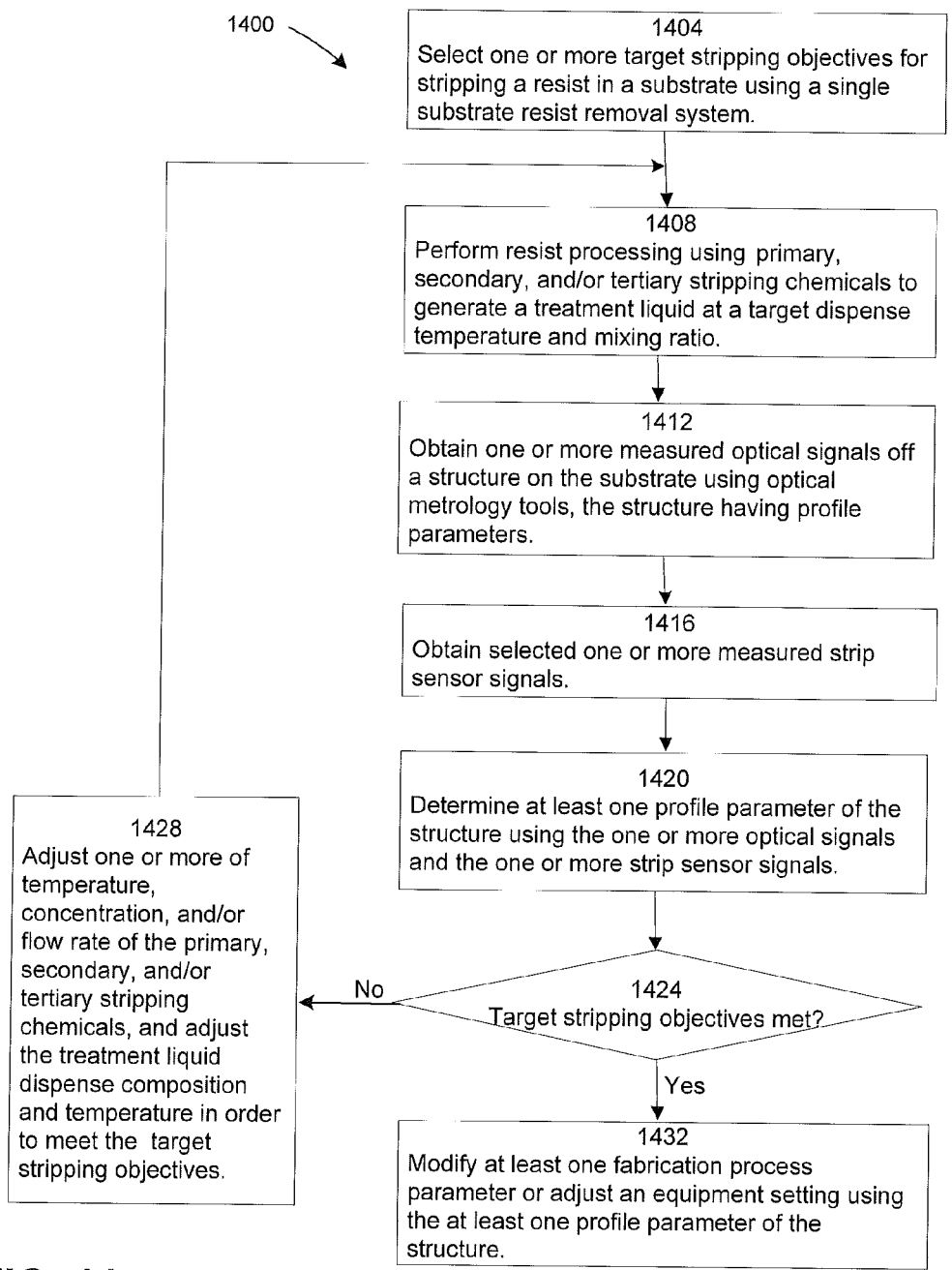
FIG. 11 is an exemplary flowchart of a method for controlling a fabrication cluster using a resist removal system configured to increase strip rate and strip selectivity of a structure on a substrate in a first fabrication cluster.

FIG. 11 is an exemplary flowchart 1400 of a method for controlling a fabrication cluster using a resist removal system configured to increase strip rate and selectivity for strip over etch of a structure on a substrate in a first fabrication cluster. In operation 1404, one or more target stripping objectives for stripping a resist in a resist removal system, which can be a batch or single substrate resist removal system, are selected. As mentioned above, the target stripping objectives can be a strip rate for the resist and/or selectivity for strip over etch of nitride, silicon oxide, and/or silicon. In operation 1408, the resist strip processing is performed using a primary, secondary, and/or tertiary stripping chemicals to generate a treatment liquid that includes reaction products, the treatment liquid at a target dispense temperature and at a target mixing ratio. As mentioned above, the primary stripping chemical can be sulfuric acid, the secondary stripping chemical can be hydrogen peroxide, and the tertiary stripping chemical can be sulfuric acid at a different temperature and mixing ratio. The operational steps and ranges of values of the strip process variables are stated above in connection with description of FIGS. 8 and 9. In operation 1412, one or more measured optical signals off a structure on the substrate using one or more optical metrology tools, the structure having a profile, the profile having profile parameters. In operation 1416, one or more measured strip sensor signals are obtained from strip sensor tools of the strip process. In operation 1420, at least one profile parameter of the structure is determined using the one or more optical signals and the one or more strip sensor signals. In operation 1424, calculated values of the target stripping objectives are compared with the target stripping objectives set in operation 1404. If the target stripping objectives are not met, in operation 1428, one or more of a concentration, flow rate and input temperature of the primary, secondary, and/or tertiary stripping chemicals, and the treatment liquid dispense composition and temperature are adjusted in order to meet the one or more target stripping objectives. Otherwise, in operation 1432, at least one fabrication process parameter of the resist removal system and/or an equipment setting in the first fabrication cluster are adjusted based on the determined at least one profile parameter. Alternatively, the at least one fabrication process parameter and/or an equipment setting can be adjusted in a subsequent or previous fabrication cluster using the at least one profile parameter.

Referring to FIGS. 5A and 5B, a controller (not shown) can be used to control the flow rates of the treatment liquid, pressure of the treatment liquid, sequencing of the use of the nozzles in the batch or single substrate strip application. A program stored in the memory of the controller can be utilized to activate the inputs to the aforementioned components of the resist removal systems 600, 650 (FIGS. 5A and 5B) according to a process recipe in order to perform the method of increasing the strip rate and selectivity of the strip over etch of silicon nitride or silicon dioxide. One example of controller 1090 is a DELL PRECISION WORKSTATION 610™, available from Dell Corporation, Austin, Tex. A controller can be locally located relative to the resist removal systems 600, 650, or it can be remotely located relative to the resist removal systems 600, 650, via an internet or intranet. Thus, the controller can exchange data with the resist removal systems 600, 650, using at least one of a direct connection, an intranet, or the internet. The controller can be coupled to an intranet at a customer site (i.e., a device maker, etc.), or coupled to an intranet at a vendor site (i.e., an equipment manufacturer). Furthermore, another computer (i.e., controller, server, etc.) can access the controller of the resist removal systems 600, 650 to exchange data via at least one of a direct connection, an intranet, or the internet.

Although exemplary embodiments have been described, various modifications can be made without departing from the spirit and/or scope of the present invention. For example, the invention was illustrated and described utilizing stripping of a resist on a substrate. Other layers or structures on a substrate can be processed using the similar methods and systems described in the specification. Therefore, the present invention should not be construed as being limited to the specific forms shown in the drawings and described above. Accordingly, all such modifications are intended to be included within the scope of this invention.

What is claimed is:

1. A method for stripping a resist on a plurality of substrates with a treatment liquid in a resist removal system comprising a processing chamber and recirculation system, the resist removal system having strip process parameters, the treatment liquid comprising a mixture of sulfuric acid and hydrogen peroxide, and one or more reactive products including persulfuric acid, the method comprising:

(a) selecting target stripping objectives for stripping the resist on the plurality of substrates, wherein each of the plurality of substrates includes one or more silicon-containing materials, and wherein the target stripping objectives include a rate of stripping the resist and a selectivity for stripping the resist versus etching of the silicon-containing materials;

(b) determining target operating ranges of the strip process parameters to achieve the target stripping objectives, the strip process parameters including a target dispense temperature and a target dispense composition for dispensing the treatment liquid into the processing chamber for exposing to the plurality of substrates, wherein the target dispense composition includes a target stripping ratio of sulfuric acid to hydrogen peroxide and a target persulfuric acid concentration;

(c) after initially establishing the treatment liquid in the processing chamber, continuously recirculating the treatment liquid from the processing chamber through a recycle line in the recirculation system and dispensing the treatment liquid back into the processing chamber at the target dispense temperature and the target dispense composition;

(e) during the recirculating, diverting a portion of the treatment liquid in the recirculation system from the recycle line to a bypass line along which is a reaction zone for generating persulfuric acid followed by a temperature adjustment zone;

(f) during the recirculating, monitoring the composition and temperature of the treatment liquid in the recirculation system and adjusting the monitored composition and/or the temperature to achieve the target dispense temperature and the target dispense composition before dispensing the treatment liquid back into the processing chamber, wherein the adjusting includes injecting sulfuric acid, or hydrogen peroxide, or both into the treatment liquid in the recirculation system to:

change the ratio of sulfuric acid to hydrogen peroxide entering the reaction zone of the bypass line to a target reaction ratio, or increase the temperature of the treatment liquid entering the reaction zone after the injecting, or both to thereby reach a target maximum temperature of a temperature profile along the reaction zone within a target time range for achieving the target persulfuric acid concentration, and modify the temperature of the treatment liquid, or the ratio of sulfuric acid to hydrogen peroxide, or both in the temperature adjustment zone of the bypass line to achieve the target dispense temperature and the target dispense composition.

2. The method of claim 1, wherein the adjusting includes increasing the temperature of the treatment liquid in the recycle line or the bypass line before the reaction zone using an inline heating device.

3. The method of claim 2, wherein the injecting includes injecting hydrogen peroxide into the bypass line to mix with the treatment liquid at the increased temperature in the reaction zone to generate persulfuric acid.

4. The method of claim 3, wherein the injecting includes injecting sulfuric acid into the treatment liquid in the temperature adjustment zone of the bypass line at a temperature below the temperature of the treatment liquid exiting the reaction zone to reduce the temperature of the treatment liquid to the target dispense temperature.

5. The method of claim 1, wherein the adjusting includes adjusting the temperature of the treatment liquid in the temperature adjustment zone of the bypass line using an inline heating or cooling device.

6. The method of claim 1, wherein the injecting includes injecting hydrogen peroxide into the bypass line to mix with the treatment liquid in the reaction zone to generate persulfuric acid.

7. The method of claim 1, further comprising increasing back pressure in the recirculation system to prevent boiling of the treatment liquid or approaching the bubble point of the treatment liquid.

8. The method of claim 7, wherein increasing the back pressure is done with a restriction downstream of the temperature adjustment zone prior to dispensing the treatment liquid back into the processing chamber.

9. The method of claim 1, wherein the target stripping objectives include a rate of 50 nm/min or higher for stripping the resist and a selectivity for stripping the resist versus etching of the silicon-containing materials of 0.7-0.15 Å of etched silicon-containing material per 1 Å of stripped resist.

10. The method of claim 1, wherein the target stripping ratio of sulfuric acid to hydrogen peroxide is in the range of 5:1 to 20:1, and the target reaction ratio of sulfuric acid to hydrogen peroxide is in the range of 1:1 to 4:1.

11. A method for stripping a resist on a plurality of substrates with a treatment liquid in a resist removal system comprising a processing chamber and recirculation system, the resist removal system having strip process parameters, the treatment liquid comprising a mixture of sulfuric acid and hydrogen peroxide, and one or more reactive products including persulfuric acid, the method comprising:

(a) selecting target stripping objectives for stripping the resist on the plurality of substrates, wherein each of the plurality of substrates includes one or more silicon-containing materials, and wherein the target stripping objectives include a rate of 500-1000 nm/min for stripping the resist and a selectivity for stripping the resist versus etching of the silicon-containing materials of 0.7-0.15 Å of etched silicon-containing material per 1 Å of stripped resist;

(b) determining target operating ranges of the strip process parameters to achieve the target stripping objectives, the strip process parameters including a target dispense temperature and a target dispense composition for dispensing the treatment liquid into the processing chamber for exposing to the plurality of substrates, wherein the target dispense composition includes a target stripping ratio of sulfuric acid to hydrogen peroxide of 5:1 to 20:1 and a target persulfuric acid concentration;

(c) after initially establishing the treatment liquid in the processing chamber, continuously recirculating the treatment liquid from the processing chamber through a recycle line in the recirculation system and dispensing the treatment liquid back into the processing chamber at the target dispense temperature and the target dispense composition;

(e) during the recirculating, diverting a portion of the treatment liquid in the recirculation system from the recycle line to a bypass line along which is a reaction zone for generating persulfuric acid followed by a temperature adjustment zone;

(f) during the recirculating, monitoring the composition and temperature of the treatment liquid in the recirculation system and adjusting the monitored composition and temperature to achieve the target dispense temperature and the target dispense composition before dispensing the treatment liquid back into the processing chamber, wherein the adjusting includes:

injecting hydrogen peroxide into the treatment liquid entering the reaction zone of the bypass line to change the ratio of sulfuric acid to hydrogen peroxide to a target reaction ratio of 1:1 to 4:1, and increasing the temperature of the treatment liquid entering the reaction zone to generate persulfuric acid sufficient to achieve the target persulfuric acid concentration within a target resident time range in the reaction zone, and injecting sulfuric acid into the treatment liquid in the temperature adjustment zone of the bypass line at a temperature and in a quantity sufficient to modify the temperature of the treatment liquid and the ratio of sulfuric acid to hydrogen peroxide to achieve the target dispense temperature and the target dispense composition.

12. The method of claim 11, wherein the increasing the temperature of the treatment liquid entering the reaction zone includes increasing the temperature of the treatment liquid in the recycle line or the bypass line before the reaction zone using an inline heating device.

13. The method of claim 11, wherein the adjusting further includes adjusting the temperature of the treatment liquid in the temperature adjustment zone of the bypass line using an inline heating or cooling device.

14. The method of claim 11, further comprising increasing back pressure in the recirculation system to prevent boiling of the treatment liquid or approaching the bubble point of the treatment liquid.

15. The method of claim 14, wherein increasing the back pressure is done with a restriction downstream of the temperature adjustment zone prior to dispensing the treatment liquid back into the processing chamber.

16. A method for stripping a resist on a plurality of substrates with a treatment liquid in a resist removal system comprising a processing chamber and recirculation system, the resist removal system having strip process parameters, the treatment liquid comprising a mixture of a first stripping chemical and a second stripping chemical, and one or more reactive products formed by reaction of the first and second stripping chemicals, the method comprising:
(a) selecting target stripping objectives for stripping the resist on the plurality of substrates, wherein each of the plurality of substrates includes one or more material layers underlying the resist, and wherein the target stripping objectives include a rate of stripping the resist and a selectivity for stripping the resist versus etching of the underlying material layers;
(b) determining target operating ranges of the strip process parameters to achieve the target stripping objectives, the strip process parameters including a target dispense temperature and a target dispense composition for dispensing the treatment liquid into the processing chamber for exposing to the plurality of substrates, wherein the target dispense composition includes a target stripping ratio of the first stripping chemical to the second stripping chemical and a target concentration of the one or more reactive products;
(c) after initially establishing the treatment liquid in the processing chamber, continuously recirculating the treatment liquid from the processing chamber through a recycle line in the recirculation system and dispensing the treatment liquid back into the processing chamber at the target dispense temperature and the target dispense composition;
(e) during the recirculating, diverting a portion of the treatment liquid in the recirculation system from the recycle line to a bypass line along which is a reaction zone for generating the one or more reactive products followed by a temperature adjustment zone;
(f) during the recirculating, monitoring the composition and temperature of the treatment liquid in the recirculation system and adjusting the monitored composition and/or the temperature to achieve the target dispense temperature and the target dispense composition before dispensing the treatment liquid back into the processing chamber, wherein the adjusting includes injecting the first stripping chemical, the second stripping chemical, or a third chemical, or any combination thereof into the treatment liquid in the recirculation system to:
change the ratio of the first stripping chemical to the second stripping chemical entering the reaction zone of the bypass line to a target reaction ratio, or increase the temperature of the treatment liquid entering the reaction zone after the injecting, or both to thereby reach a target maximum temperature of a temperature profile along the reaction zone within a target time range for achieving the target concentration of the one or more reactive products, and
modify the temperature of the treatment liquid, or the ratio of the first stripping chemical to the second stripping chemical, or both in the temperature adjustment zone of the bypass line to achieve the target dispense temperature and the target dispense composition.

17. The method of claim 16 wherein the first stripping chemical is an acid, the second stripping chemical is an oxidizer, and the third chemical is the same acid as the first stripping chemical.

18. The method of claim 16, wherein:
the first stripping chemical is sulfuric acid, the second stripping chemical is nitric acid, and the third chemical is hydrogen peroxide; or
the first stripping chemical is hydrochloric acid and the second stripping chemical is nitric acid; or
the first stripping chemical is hydrogen fluoride, the second stripping chemical is nitric acid, and the third chemical is acetic acid; or
the first stripping chemical is sulfuric acid and the second stripping chemical is ozone.

19. The method of claim 16, wherein the adjusting includes increasing the temperature of the treatment liquid in the recycle line or the bypass line before the reaction zone using an inline heating device.

20. The method of claim 19, wherein the injecting includes injecting the second stripping chemical into the bypass line to mix with the treatment liquid at the increased temperature in the reaction zone to generate the one or more reactive products.

21. The method of claim 20, wherein the injecting includes injecting the third chemical into the treatment liquid in the temperature adjustment zone of the bypass line at a temperature below the temperature of the treatment liquid exiting the reaction zone to reduce the temperature of the treatment liquid to the target dispense temperature.

22. The method of claim 16, wherein the adjusting includes adjusting the temperature of the treatment liquid in the temperature adjustment zone of the bypass line using an inline heating or cooling device.

23. The method of claim 16, wherein the injecting includes injecting the second stripping chemical into the bypass line to mix with the treatment liquid in the reaction zone to generate the one or more reactive products.

24. The method of claim 16, further comprising increasing back pressure in the recirculation system to prevent boiling of the treatment liquid or approaching the bubble point of the treatment liquid.

25. The method of claim 24, wherein increasing the back pressure is done with a restriction downstream of the temperature adjustment zone prior to dispensing the treatment liquid back into the processing chamber.

* * * * *